(12) United States Patent
Bemmerl et al.

(10) Patent No.: US 10,978,378 B2
(45) Date of Patent: Apr. 13, 2021

(54) ENCAPSULATED LEADLESS PACKAGE HAVING AN AT LEAST PARTIALLY EXPOSED INTERIOR SIDEWALL OF A CHIP CARRIER

(71) Applicant: Infineon Technologies AG, Neubiberg (DE)

(72) Inventors: Thomas Bemmerl, Schwandorf (DE); Kuok Wai Chan, Melaka (MY); Christoph Liebl, Munich (DE); Bun Kian Tay, Melaka (MY); Wee Boon Tay, Melaka (MY); Wae Chet Yong, Malacca (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/219,415

(22) Filed: Dec. 13, 2018

(65) Prior Publication Data
US 2019/0189542 A1   Jun. 20, 2019

(30) Foreign Application Priority Data
Dec. 14, 2017 (DE) .................... 10 2017 129 924.6

(51) Int. Cl.
*H01L 23/48* (2006.01)
*H01L 23/495* (2006.01)
(Continued)

(52) U.S. Cl.
CPC .... *H01L 23/49503* (2013.01); *H01L 21/4828* (2013.01); *H01L 21/56* (2013.01); *H01L 23/31* (2013.01); *H01L 23/3157* (2013.01); *H01L 24/49* (2013.01); *H01L 23/3107* (2013.01); *H01L 23/49548* (2013.01); *H01L 24/29* (2013.01); *H01L 24/45* (2013.01); *H01L 24/48* (2013.01); *H01L 24/73* (2013.01); *H01L 2224/29101* (2013.01); *H01L 2224/32245* (2013.01); *H01L 2224/45014* (2013.01); *H01L 2224/45124* (2013.01); *H01L 2224/45147* (2013.01); *H01L 2224/48091* (2013.01); *H01L 2224/48247* (2013.01); *H01L 2224/48465* (2013.01); *H01L 2224/49171* (2013.01); *H01L 2224/73265* (2013.01); *H01L 2924/13055* (2013.01); *H01L 2924/181* (2013.01); *H01L 2924/1815* (2013.01)

(58) Field of Classification Search
CPC ..... H01L 2224/73265; H01L 2924/181; H01L 2224/48227; H01L 24/48; H01L 23/49541; H01L 24/49; H01L 23/49548; H01L 24/45
USPC ................ 257/690, 692, 693, 694, 696, 787
See application file for complete search history.

(56) References Cited

U.S. PATENT DOCUMENTS 5,835,988 A * 11/1998 Ishii .................... H01L 23/3107
257/684
6,498,099 B1   12/2002 McLellan et al.
(Continued)

*Primary Examiner* — S. V. Clark
(74) *Attorney, Agent, or Firm* — Murphy, Bilak & Homiller, PLLC

(57) ABSTRACT

A leadless package includes an at least partially electrically conductive carrier having a mounting section and a lead section, an electronic chip mounted on the mounting section, and an encapsulant at least partially encapsulating the electronic chip and partially encapsulating the carrier so that at least part of an interior sidewall of the lead section not forming part of an exterior sidewall of the package is exposed.

13 Claims, 23 Drawing Sheets

(51) Int. Cl.
*H01L 23/00* (2006.01)
*H01L 21/48* (2006.01)
*H01L 21/56* (2006.01)
*H01L 23/31* (2006.01)

(56) References Cited

U.S. PATENT DOCUMENTS

| | | | |
|---|---|---|---|
| 8,878,361 B2* | 11/2014 | Do | H01L 23/49582 257/738 |
| 2004/0080026 A1 | 4/2004 | Minamio et al. | |
| 2007/0052076 A1* | 3/2007 | Ramos | H01L 21/4832 257/676 |
| 2009/0302445 A1* | 12/2009 | Pagaila | H01L 25/50 257/678 |
| 2016/0056097 A1* | 2/2016 | Bai | H01L 23/49582 257/670 |
| 2019/0122967 A1* | 4/2019 | Truhitte | H01L 23/49541 |
| 2019/0189542 A1* | 6/2019 | Bemmerl | H01L 23/498 |
| 2019/0267311 A1* | 8/2019 | Arellano | H01L 23/49503 |
| 2019/0385938 A1* | 12/2019 | Shi | H01L 23/49548 |

* cited by examiner

ENCAPSULATED LEADLESS PACKAGE HAVING AN AT LEAST PARTIALLY EXPOSED INTERIOR SIDEWALL OF A CHIP CARRIER

TECHNICAL FIELD

The present disclosure relates to leadless packages, an electronic device, a method of manufacturing a leadless package, and a method of manufacturing an electronic device.

BACKGROUND

A package, for instance for automotive applications, provides a physical containment for one or more electronic chips comprising one or more integrated circuit elements. Examples of integrated circuit elements of packages are a field effect transistor, an insulated-gate bipolar transistor (IGBT), a diode, and passive components (such as an inductance, a capacity, a resistor). Moreover, such packages may be used for producing a system-in-package.

Leaded packages have many advantages such as electrical reliability.

Leadless packages have many advantages such as simple manufacturability and high mechanical robustness.

However, there is still potentially room to improve (for instance solder) joint reliability of a leadless package mounted on a mounting base (such as a printed circuit board).

SUMMARY

There may be a need for a leadless package with high joint reliability when mounted on a mounting base.

According to an exemplary embodiment, a leadless package is provided which comprises an at least partially electrically conductive carrier comprising a mounting section and a lead section, an electronic chip mounted on the mounting section, and an encapsulant at least partially encapsulating the electronic chip and partially encapsulating the carrier so that at least part of an interior sidewall of the lead section not forming part of (for instance facing away from) an exterior sidewall (or a lateral outline) of the package is exposed.

According to another exemplary embodiment, an electronic device is provided which comprises a mounting base, a leadless package having the above-mentioned features mounted on the mounting base, and a coupling structure electrically and mechanically coupling the package with the mounting base so that the coupling structure contacts at least part of the at least partially exposed interior sidewall of the lead section.

According to another exemplary embodiment, a method of manufacturing a leadless package is provided, wherein the method comprises mounting an electronic chip on a mounting section of a carrier, and at least partially encapsulating the electronic chip and partially encapsulating the carrier by an encapsulant so that at least part of an interior sidewall of the lead section not forming part of an exterior sidewall of the package is exposed.

According to still another exemplary embodiment, a method of manufacturing an electronic device is provided, wherein the method comprises manufacturing a leadless package having the above-mentioned features, and mounting the package on a mounting base by a coupling structure electrically and mechanically coupling the package with the mounting base so that the coupling structure contacts at least part of the at least partially exposed interior sidewall of the lead section.

According to still another exemplary embodiment, a leadless package is provided which comprises an at least partially electrically conductive carrier comprising a mounting section and a lead section, an electronic chip mounted on the mounting section, and an encapsulant at least partially encapsulating the electronic chip and partially encapsulating the carrier so that, in addition to an exterior sidewall of the lead section, which exterior sidewall forms part of an exterior lateral outline of the package, at least part of at least one further sidewall of the lead section, which at least one further sidewall is located inside of the exterior lateral outline of the package, is exposed for being covered by a coupling structure (such as a solder).

According to an exemplary embodiment, a leadless package is provided which has a very high board level reliability. This high board level reliability can be obtained by exposing an interior surface area of a lead section of a carrier (such as a leadframe) on which one or more electronic chip is mounted. When this interior sidewall remains partially or completely exposed after completing formation of an encapsulant (such as a mold compound), a connection structure (such as solder) on a mounting base (for instance a printed circuit board, PCB) can contact the lead section over a significant surface area, including at least part of the interior sidewall of the lead section. In contrast to conventional approaches, this renders it possible to not only contact the coupling structure with an exterior sidewall and a bottom area of the lead section, but also to the interior sidewall thereof being exposed with regard to the encapsulant. Thereby, the reliability of the electric and mechanical connection between package and mounting base can be significantly increased. This renders the leadless package in particular robust against temperature changes, mechanical impact and other distortions acting on an interface between lead section and coupling structure. Exemplary embodiments may thereby overcome the conventional shortcoming that, when a leadless package is mounted on a mounting base, a resulting mismatch between the coefficients of thermal expansion of the material of the leadless package and the different material of the mounting base may cause a high mechanical load in the presence of temperature changes limiting lifetime of the electronic device. Conventionally, such thermal load acts on a relatively small connection area between lead section and coupling structure (in particular solder). By exposing at least part of the interior sidewall(s) of the lead section of the carrier of the leadless package, the connection area between lead section and coupling structure can be increased and the electronic device can be rendered more robust against thermally induced load. More specifically, such a high connection area may preferably render all lateral lead surface areas wetted by material of a coupling structure such as a solder.

In the following, further exemplary embodiments of the leadless packages, the electronic device, and the manufacturing methods will be explained.

In the context of the present application, the term "carrier" may particularly denote an at least partially electrically conductive structure which serves simultaneously as a mounting base for one or more electronic chips and also contributes to the electric connection of the electronic chip(s) with an electronic environment of the leadless package, in particular with the mounting base of the electronic device. In other words, the chip carrier may fulfil a mechanical support function and an electric connection function. A preferred embodiment of a carrier is a leadframe.

In the context of the present application, the term "leadless package" may particularly denote a package which comprises substantially no leads extending out of the carrier beyond the encapsulant.

In one configuration of a leadless package, one or multiple batch-level caps of encapsulant material (in particular of mold compound) may be formed on a carrier on which multiple electronic chips (which may be connected to the carrier by one or more connection elements such as bond wires) for multiple packages are mounted, wherein one cap of encapsulant may be provided for multiple packages in common. Subsequently, the arrangement formed of carrier, electronic chips, and cap may be singularized (for instance by sawing) into multiple leadless packages. As a result, lead bodies of the carrier may extend up to and may be in alignment with a lateral sidewall of the encapsulant. Such a leadless package can also be denoted as map-mold type leadless package.

In another configuration of a leadless package, multiple package-level caps of encapsulant material (in particular of mold compound) may be formed on a carrier on which multiple electronic chips (which may be connected to the carrier by one or more connection elements such as bond wires) for multiple packages are mounted, wherein one cap of encapsulant may be provided per package. Subsequently, the arrangement formed of carrier, electronic chips, and caps may be singularized (for instance by punching) into multiple leadless packages. As a result, lead bodies of the carrier may extend slightly beyond a lateral sidewall of the encapsulant. Such a leadless package can also be denoted as cavity-mold type leadless package.

In a leadless package, a partially encapsulated carrier having a lead section and carrying an electronic chip does not have springy metal leads (sometimes referred to as legs) that are mounted to a mounting base such as a printed circuit board. In contrast to this in a leaded package, a carrier such as a leadframe has springy metal leads that are mounted to a mounting base such as a printed circuit board. Examples of leadless packages are QFN packages, MLF packages, SON packages, etc. In contrast to this, examples of packages with leads are QFP packages, DSO packages, TSSOP packages, etc.

In the context of the present application, the term "exterior sidewall" of the package may denote an exterior lateral surface defining part of the lateral outline of the package. The exterior sidewall of the package may comprise an exterior lateral surface portion of the encapsulant and an exterior lateral surface portion of the lead section of the carrier. The latter may particularly denote a slanted or vertical wall of the part of the carrier contributing to a lateral exterior surface of the entire package. For instance, such an exterior sidewall of the lead section may be exposed with regard to the encapsulant by singularizing packages manufactured by batch processing, for instance by sawing or punching.

In the context of the present application, the term "interior sidewall" of the lead section of the carrier may particularly denote a slanted or vertical wall of a part of the carrier serving to contact the package with a mounting base such as a PCB. The interior sidewall may be oriented in an interior of the package rather than forming part of a lateral outline of the package, whereas the exterior sidewall may be oriented towards or may form part of an exterior outline of the package. When a lead section has for instance a rectangular or substantially rectangular cross-section and extends up to the exterior outline of the entire package, it may have four circumferentially connected sidewalls, i.e. three interior and one exterior sidewall.

In an embodiment of the package, in addition to an exterior sidewall of the lead section, which exterior sidewall forms part of an exterior lateral outline of the package, at least part of at least one further interior sidewall of the lead section, which at least one further sidewall is located inside of the exterior lateral outline of the package, is exposed for being covered by solder. In an embodiment of a corresponding electronic device, both at least part of the exposed exterior sidewall and at least part of the one or more at least partially exposed interior sidewalls of the lead section may be covered with the coupling structure.

In an embodiment, the encapsulant partially encapsulates the carrier so that at least part of at least two sidewalls, in particular of all sidewalls, of the lead section not forming part of an exterior sidewall of the package is exposed. For example, the coupling structure may have a U-shaped section which partially circumferentially contacts at least part of three exposed sidewalls of the lead section. In these embodiments, not only a single interior sidewall is at least partially exposed with regard to the encapsulant, but additionally also one or more further sidewalls. For example, also the exterior sidewall may be exposed, so that both opposing interior and exterior sidewalls may contribute to the connection surface with the connection structure. Even more preferred is a configuration in which all four sidewalls delimiting a lead section along its perimeter are at least partially exposed so as to contribute to the connection area with the coupling structure. This further improves the board level reliability of the package as a whole.

In an embodiment, the encapsulant partially encapsulates the carrier so that at least part of the sidewalls of the lead section is fully circumferentially exposed. Preferably, the coupling structure may have an annular section which fully circumferentially contacts at least part of all exposed sidewalls of the lead section. In such a preferred embodiment, the entire perimeter of the lead section is exposed uninterruptedly with regard to the encapsulant and can provide a continuous contact area extending along a 360° angle. A corresponding package shows outstanding properties in terms of board level reliability.

In an embodiment, the lead section comprises a plurality of spaced lead bodies which may be separate. At least one of these lead bodies, in particular each of them, may have an at least partially exposed interior sidewall not forming part of exterior sidewalls of the package in a lateral direction. In such an embodiment, the mounting section may for example form a central portion of the carrier being surrounded by lead bodies along at least two sides (i.e. at exactly two sides, as in a SON package, or at exactly three sides) or even four sides (as in a QFN package) thereof. When multiple of such lead bodies have an exposed sidewall area not only at an exterior surface, the connection strength with the coupling structure may be further improved. It is however alternatively also possible that only one or only a part of these lead bodies has an at least partially exposed interior sidewall. In another embodiment, it is alternatively of course possible that one or more lead bodies are provided only at one side of the central portion of the carrier (for instance in a leadless power package).

In an embodiment, a bottom surface of the encapsulant has at least one recess or indentation at least partially exposing at least one of the interior sidewalls of the lead bodies. For instance, such a recess may be formed by selectively removing material of the encapsulant after encapsulation (for instance by laser processing) or by a highly flexible temporary foil covering corresponding sidewall portions during encapsulation.

In an embodiment, the at least one recess at least partially surrounds at least part, in particular each, of the lead bodies individually so that spaces between at least partially exposed interior sidewalls of the lead bodies remain at least partially filled with material of the encapsulant (compare for instance FIG. 24). For example, the recess may be U-shaped and may extend along all three interior sidewalls of an assigned lead body. A pronounced improvement of the board level reliability in the presence of thermal load could be shown for such an embodiment by simulations (compare FIG. 39).

In an embodiment, the at least one recess extends only along one at least partially exposed interior sidewall of at least one of the lead bodies, in particular of each of the lead bodies in common (compare for instance FIG. 25). For example, a straight recess may be formed between two opposing lateral ends of the package which recess exposes one interior sidewall per lead body, or even only part of one interior sidewall per lead body. Board level reliability can be improved by taking this measure which involves only a small additional effort during manufacturing the leadless package.

In an embodiment, the at least one recess at least partially exposes at least part of (in particular of each of) the lead bodies in common in such a way that spaces between at least partially exposed interior sidewalls of the lead bodies are free of material of the encapsulant (compare for instance FIG. 26). Since encapsulant material can be removed relatively unspecifically in such an embodiment, the corresponding manufacturing effort is moderate. A pronounced improvement of the board level reliability in the presence of thermal load could be shown for such an embodiment by simulations (compare FIG. 39).

In an embodiment, at least two of the lead bodies form a continuous integral portion of the carrier (and may for instance be free of an exposed interior sidewall), and at least one other of the lead bodies having the at least partially exposed interior sidewall is separated from the other lead bodies in an interior of the package. It has turned out that in particular those lead bodies are prone to electric or mechanical failure due to thermal load caused by a mismatch of the coefficients of thermal expansion between mounting base and leadless package which are mechanically isolated or separated from other lead bodies, i.e. which are not fused with one or more other lead bodies. It is therefore particularly advantageous to expose one or more interior sidewalls of such single lead bodies. In contrast to this, multiple fused lead bodies being integrally connected to one another turned out as less prone to damage in the presence of thermal load so that sidewall exposure of such lead bodies may be omitted in a low manufacturing effort embodiment. However, it is alternatively possible that also fused lead bodies are provided with one or more exposed interior sidewalls as well.

In an embodiment, one of the lead bodies having the at least partially exposed interior sidewall is located in a corner of the package. Simulations have shown that in particular the lead bodies located closest to a corner of a package (having a rectangular outline) are specifically prone to failure in the presence of thermal load. Thus, specifically exposing sidewalls of one or more lead bodies located in a package corner has a particular strong impact on the increase of electrical reliability of the corresponding leadless package.

In an embodiment, at least one of the lead bodies having the at least partially exposed interior sidewall is located completely in an interior of the package spaced with regard to an exterior lateral surface of the package. In many cases, leadless packages comprise lead bodies extending up to or even slightly beyond a lateral surface of the encapsulant. However, it is also possible, additionally or alternatively, that one or more lead bodies are arranged in an interior of the leadless package, i.e. have sidewalls being fully circumferentially surrounded by encapsulant material. In such a configuration, it is possible that a lead body with fully circumferentially encapsulated sidewalls and only having an exposed bottom wall are made subject to a material removal procedure by which one, multiple or even all sidewalls are at least partially exposed with regard to the encapsulant. This may significantly improve reliability of the obtained leadless package or electronic device.

In an embodiment, the mounting section is partially exposed with regard to the encapsulant so that at least part of sidewalls of the mounting section is exposed with regard to the encapsulant. When also exposing at least a portion of a sidewall of the mounting section carrying the one or more electronic chips, also this surface may provide a contribution to the connection with the coupling structure. Damage of an electric connection between leadless package and mounting base may therefore further be efficiently suppressed.

In an embodiment, an entire bottom surface of the carrier protrudes beyond an entire bottom surface of the encapsulant. In other words, an entire bottom surface of the encapsulant may be in a raised position with regard to an entire bottom surface of the carrier. In other words, the entire bottom surface of the carrier (including its lead section and its mounting section) may protrude downwardly beyond the lower main surface of the encapsulant to form also part of an exterior surface of the package. By such a configuration, the bottom portion of the carrier may extend partially or entirely into material of the coupling structure.

In an embodiment, an exposed portion of the interior sidewall has a height of at least 40 μm, in particular of at least 70 μm. Keeping at least 40 μm, preferably at least 70 μm, of the interior sidewall of the lead section free of encapsulant material allows obtaining a highly efficient leadless package in terms of board level reliability.

In an embodiment, a ratio between a height up to which the interior sidewall of the lead section is exposed with regard to the encapsulant on the one hand, and a (for instance uniform or maximum) thickness of the carrier on the other hand is at least 20%, in particular is at least 30%, more particularly is at least 50%. For instance, the thickness of the carrier may be in a range between 200 μm and 300 μm. When the mentioned condition is fulfilled, a particularly pronounced increase of the lifetime of the electronic device can be obtained due to an efficient suppression of thermal load based damages.

In an embodiment, an exposed bottom surface of the encapsulant has a uniform height level and may be planar. In other words, the entire lower main surface of the encapsulant being exposed and thereby forming an exterior surface of the leadless package may be at the same height level. Such a geometry may be obtained for example by exposing the one or more sidewalls of the lead section using a temporary foil keeping respective surface portions free of encapsulant during an encapsulation procedure.

In another embodiment, an exposed bottom surface of the encapsulant, in particular an exposed bottom surface portion of the encapsulant between the mounting section and the lead section, has a surface profile and may be non-planar. Such a surface profile of a bottom portion of the encapsulant may be obtained for instance by selectively removing portions of the encapsulant after the encapsulation to thereby expose a portion of the surface of the carrier.

In an embodiment, the carrier is a leadframe. Such a leadframe may be a sheet-like metallic structure which can be patterned so as to form one or more mounting sections for mounting the one or more electronic chips of the package, and one or more lead sections for electric connection of the package to an electronic environment when the electronic chip(s) is/are mounted on the leadframe. In an embodiment, the leadframe may be a metal plate (in particular made of copper) which may be patterned, for instance by stamping or etching. Forming the chip carrier as a leadframe is a cost-efficient and mechanically as well as electrically highly advantageous configuration in which a low ohmic connection of the at least one electronic chip can be combined with a robust support capability of the leadframe. Furthermore, a leadframe may contribute to the thermal conductivity of the package and may remove heat generated during operation of the electronic chip(s) as a result of the high thermal conductivity of the metallic (in particular copper) material of the leadframe.

However, other carriers may be implemented as well. For instance, a direct copper bonding substrate (DCB substrate) or a direct aluminum bonding substrate (DAB substrate) can be used as well as a basis for a carrier.

In an embodiment, the electronic chip is a semiconductor chip, in particular a power semiconductor chip. In particular when the at least one electronic chip is a power semiconductor chip, significant amount of heat generated during operation of the leadless package may result in thermal load acting on the electric and mechanical interface between package and mounting base. However, due to the increased connection surface between lead section and coupling structure, damage of the package may be prevented even under such harsh conditions.

In an embodiment, the package comprises at least one electrically conductive connection element, in particular at least one of a bond wire, a bond ribbon and a clip, electrically connecting the electronic chip with the lead section. A clip may be a three-dimensionally bent plate type connection element which has two planar sections to be connected to an upper main surface of the respective electronic chip and an upper main surface of the chip carrier, wherein the two mentioned planar sections are interconnected by a slanted connection section. As an alternative to such a clip, it is possible to use a bond wire or bond ribbon which is a flexible electrically conductive wire or ribbon shaped body having one end portion connected to the upper main surface of the respective transistor chip and having an opposing other end portion being electrically connected to the chip carrier. Within the encapsulant, an electrically conductive connection may be formed by the connection element between a chip pad at an upper main surface of the chip mounted on the mounting section on the one hand and a lead section of the carrier on the other hand. Clips, bond wires and bond ribbons (for instance made of copper and/or aluminum) may be used for that purpose.

In an embodiment, the at least one electrically conductive connection element is at least partially encapsulated by the encapsulant. When being arranged partially or preferably entirely within the encapsulant, mechanical damage of the tiny connection element may be prevented.

In an embodiment, the coupling structure comprises or consists of a solder. For instance, solder paste may be applied on a connection surface of the mounting base before attaching the package thereon.

In an embodiment, the coupling structure contacts an exposed sidewall portion of the mounting section. Connecting both exposed sidewalls of the lead section and of the mounting section further increases the reliability of the electric connection between package and mounting base.

In an embodiment, a mean thickness of the coupling structure in a lateral direction on the interior sidewall of the lead section facing away from an exterior sidewall of the package is larger than an average thickness of the coupling structure in a lateral direction at the exterior sidewall of the lead section (see for instance FIG. 7). Highly advantageously, a locally increased thickness of the coupling structure adjacent to the interior sidewall of the lead section being at least partially exposed can render the entire electronic device even more robust against thermal stress.

In an embodiment, the method comprises attaching a foil with a surface profile to a bottom surface of the carrier prior to the encapsulating and in such a manner that the foil protrudes upwardly (for instance between the mounting section and the lead section) to at least partially cover an interior sidewall of the lead section. When attaching a temporary non-planar foil to the surface of the carrier (in particular of the lead section thereof) which shall remain free of encapsulant after encapsulation, a mere removal of this foil from the mentioned surface is sufficient to ensure that the exposed surface of the lead section is increased as compared to conventional approaches and can therefore be contacted with higher reliability by the connection structure. Preferably, the foil may be made of a very soft and properly deformable material covering a significant portion of sidewalls of the carrier when being attached to the carrier. In other words, the method may comprise attaching a curved or bent foil to a bottom surface of the carrier prior to the encapsulating and in such a manner that the foil is bent upwardly between the mounting section and the lead section. The foil may be removed after the encapsulating.

In an embodiment, the method comprises removing material of the encapsulant, in particular by laser cutting, to thereby at least partially expose the interior sidewall of the lead section. As an addition or an alternative to the above-mentioned implementation of a temporary foil, it is possible to selectively remove portions of the encapsulant after encapsulation to thereby expose the sidewall portions of the lead section used for contacting the coupling structure. This material removing process may be realized by laser cutting. Alternatively, also mechanical cutting or chemical etching may be implemented for this purpose.

In an embodiment, the method comprises removing material of the carrier, in particular by etching, to thereby at least partially expose the sidewall of the lead section. In order to expose a sidewall portion of the carrier (in particular of the lead section) it may also be possible to remove material of the carrier after the encapsulation to thereby expose the respective surface portion.

In an embodiment, the package comprises an encapsulant. The mentioned encapsulant may provide for a mechanical protection and an electric isolation of the encapsulated electronic chip(s) and the encapsulated portion of the chip carrier. In particular, the encapsulant may be selected from a group consisting of a mold compound, and a laminate. For the encapsulating by molding, a plastic material or a ceramic material may be used. The encapsulant may comprise an epoxy material. Filler particles (for instance $SiO_2$, $Al_2O_3$, $Si_3N_4$, BN, AlN, diamond, etc.), for instance for improving thermal conductivity, may be embedded in an epoxy-based matrix of the encapsulant.

As substrate or wafer forming the basis of the electronic chip(s), a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.).

The above and other objects, features and advantages of the present invention will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments and constitute a part of the specification, illustrate exemplary embodiments. In the drawings:

FIG. 27 illustrates a cross-sectional view of an electronic device comprising a mounting base and the package of FIG. 26 as well as a solder-type coupling structure in between.

DETAILED DESCRIPTION

Figure 1:
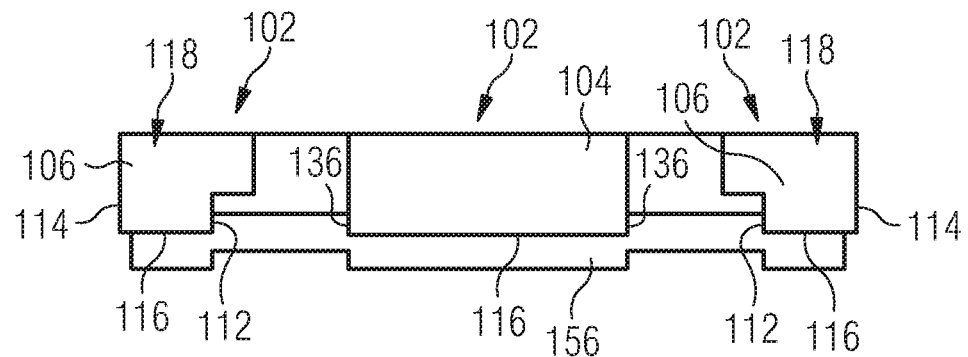
FIG. 1 to FIG. 3 show cross-sectional views of structures obtained during carrying out a method of manufacturing a leadless packages and an electronic device, illustrated in FIG. 3, according to an exemplary embodiment.

The illustration in the drawings are schematic. Before describing further exemplary embodiments in further detail, some basic considerations of the present invention will be summarized based on which exemplary embodiments have been developed.

According to an exemplary embodiment, a leadless package with enhanced board level reliability is provided.

Solder joint reliability or board-level reliability is an important parameter to consider when predicting the overall reliability of a semiconductor product such as a package. The board level reliability of leadless packages is of smaller performance than packages with leads which can better compensate stress at formed leads due to their load-equilibrating spring function, fully surrounded by solder. Thus, there is high interest in leadless packages capable for higher reliability requirements.

An exemplary embodiment provides an improvement for the board level reliability of leadless packages (which may be of cavity-mold type or map-mold type).

A conventionally applied measure to improve the board level reliability for leadless packages is to increase the lead length. A resulting disadvantage is however that such a configuration involves less space for the die pad (also denoted as mounting section of the carrier) and/or a larger package size. Another option is to increase the lead width which however has the disadvantage of a wider lead pitch (if no change in lead-to-lead clearance is made) and/or a larger package size. Conventionally, it has also been tried to use an optimized package material set (for example a low stress mold compound) which however increases the effort of manufacturing the packages.

Contrary to conventional approaches, an exemplary embodiment provides an increased or even maximized solder wetting area and volume at the lead section of the leadless package. This in particular means that instead of solder wetting at lead bottom and lead tip side (i.e. singulation side at a lateral outline of the package), the lead section may be fully surrounded by solder, which may result in enhanced board level reliability. In particular, this may be realized by leveling the bottom molding side (i.e. mold compound stand-off). For example, an extraordinarily soft and flexible film-assisted molding foil which may be laminated to the carrier (such as a leadframe) may take care during molding that also one or more of the interior sidewalls of the lead section will not be covered by mold compound (or another type of encapsulant) and therefore stay exposed as solder wetting area.

Hence, an exemplary embodiment realizes a surrounded (in particular maximized) solder wetting at the lead section (composed of one or more lead bodies or leads) of a leadless package, resulting in enhanced board level reliability. This may be achieved by leveling the package bottom side (for instance by a mold stand-off) by using a soft and flexible film-assisted molding foil.

An improved board level reliability of leadless packages, especially for automotive applications, may also be achieved by providing a leadless package with heeled leads. A corresponding exemplary embodiment provides an improvement for board level reliability of leadless packages independent of leadframe processing (for instance by etching, stamping, etc.) which may be applied both for cavity-mold type and map-mold type manufacturing architectures. Also such an exemplary embodiment ensures a high solder wetting area and volume at the leads of the leadless package. Instead of solder wetting at lead bottom and lead tip side (i.e. a singulation side) only, the leads may be preferably fully surrounded by solder or another material of the coupling structure, resulting in enhanced board level reliability. This may be realized by forming a selective mold compound groove or recess around the leads at the bottom molding side. There are different embodiments of manufacturing such mold compound grooves or recesses, for example one or more of the following:

a) laser cutting (in particular line cut) around leads (or another material removal process, for instance by mechanically and/or chemically removing material)

b) laser cutting (in particular line cut) at the inner end of the leads (or another material removal process, for instance by mechanically and/or chemically removing material)

c) laser cutting (in particular area cut) at the inner end and area between the leads (or another material removal process, for instance by mechanically and/or chemically removing material)

d) leadframe etching (etch away carrier material, in particular copper, in between leads) to create individual leads.

All these embodiments may result in heeled leads as a basis for fully surround solder wetted leads, resulting in enhanced board level reliability. Such embodiments may involve a change in footprint to enlarge solder pads towards the package center to realize a particularly high degree of board level reliability.

A gist of an exemplary embodiment is to realize a surrounded and thereby enlarged (in particular maximized) solder wetting zone at the leads of a leadless package, resulting in enhanced board level reliability. The heeled leads may be reached by selective mold compound removal around the leads.

Figure 2:
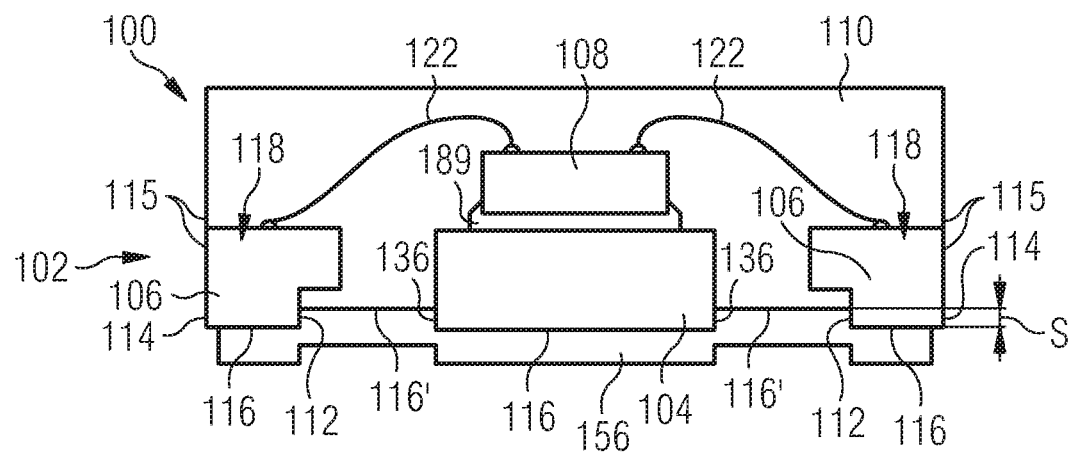
Figure 3:
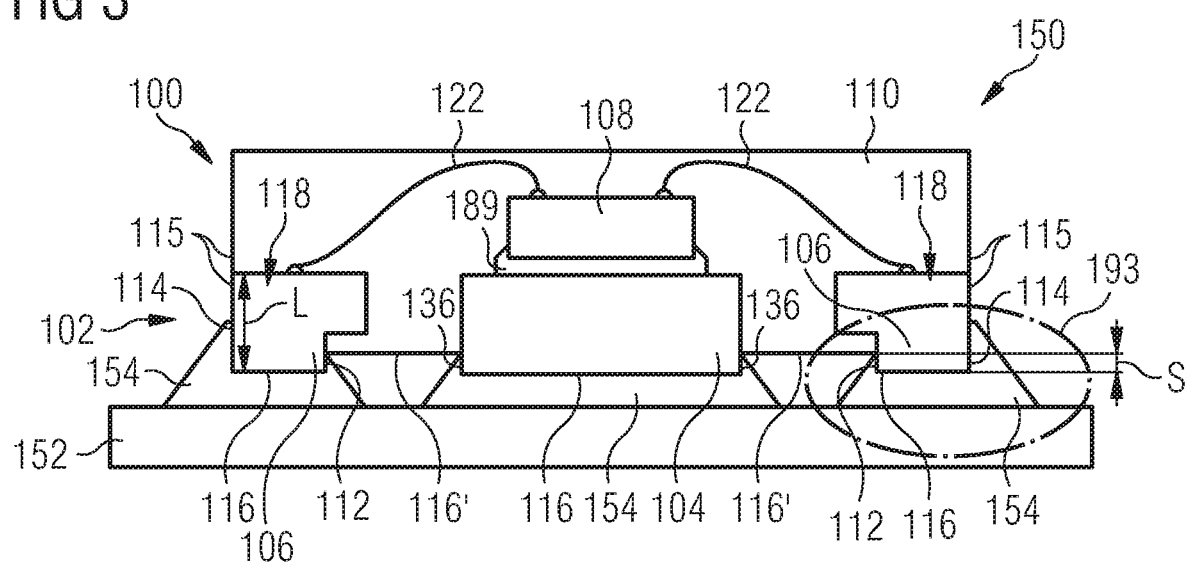

FIG. 1 to FIG. 3 show cross-sectional views of structures obtained during carrying out a method of manufacturing a leadless packages 100 and an electronic device 150, illustrated in FIG. 3, according to an exemplary embodiment.

FIG. 1 illustrates a cross-sectional view of an electrically conductive carrier 102, which is here embodied as leadframe made of copper (however, the carrier 102 may also comprise, additionally or alternatively, any other appropriate material, such as aluminum or steel), and which is used as a starting point for manufacturing the leadless package 100 and the electronic device 150. The carrier 102 is composed of a central mounting section 104 (serving as a die pad) surrounded laterally by a lead section 106 (functioning as leads of the carrier 102). As can be taken from FIG. 1, the lead section 106 comprises a plurality of spaced lead bodies 118. Moreover, a soft and flexible adhesive foil 156 with a surface profile is attached to a bottom surface 116 of the carrier 102 prior to a subsequent encapsulating process and in such a manner that the foil 156 protrudes upwardly between the mounting section 104 and the lead section 106 to at least partially cover interior sidewalls 112 of the lead section 106 facing away from exterior sidewall 114 of the lead section 106. Thus, the curved or bent foil 156 is attached to the bottom surface 116 of the carrier 102 in such a manner that the foil 156 is raised between the mounting section 104 and the lead section 106 for interior sidewall coverage. Foil 126 avoids mold flash and ensures a mold-standoff during subsequent encapsulation (compare FIG. 2), and therefore provides side-exposed leadframe structures. For example, the foil 126 may be specifically provided with a thick soft layer. For example, a base layer of the foil 126 may be a harder carrier foil having a softer alignment part. To fulfill the described function, the foil 126 may also be configured as a multi-layer foil.

FIG. 2 illustrates a pre-form of a leadless package 100 according to an exemplary embodiment, still having foil 156 attached to the bottom surface 116 thereof. The preform of the leadless package 100 according to FIG. 2 is obtained by mounting an electronic chip 108 (in particular a power semiconductor chip, alternatively a plurality of electronic chips 108) on the mounting section 104 of the carrier 102. The electronic chip 108 is electrically and mechanically coupled to the mounting section 104 by a connection structure 189 (such as a solder). Thereafter, electrically conductive connection elements 122 (bond wires in the shown embodiment) are connected between a respective pad on an upper main surface of the electronic chip 108 and a respective one of the lead bodies 118 of the lead section 106.

After that, the electronic chip 108, the connection structure 189, the connection elements 122 and part of the carrier 102 are encapsulated by an encapsulant 110 such as a mold compound while the foil 156 is still connected to the bottom surface 116 and side surfaces of the carrier 102. After encapsulation, foil 156 may be removed to thereby obtain the readily manufactured leadless package 100. Due to the presence of the foil 156 during encapsulation, the entire bottom surface 116 of the carrier 102 protrudes downwardly beyond entire bottom surface 116' of the encapsulant 110. As can be taken from FIG. 2, a mold stand-off, s, is obtained by this manufacturing process. More specifically, the encapsulant 110 only partially encapsulates the carrier 102 in such a way that part of interior sidewalls 112 of the lead bodies 118 of the lead section 106 not forming part of and facing away from a respective portion of an exterior sidewall 115 of the package 100 is exposed. Thus, a respective further portion of sidewall 112 located inside of the exterior lateral outline of the package 100 is exposed in addition to exterior sidewalls 114 of the lead section 106. Thus, in addition to the exterior sidewalls 114 of the lead section 106, also parts of the further interior sidewalls (see reference numerals 112 in FIG. 2, as well as reference numerals 130, 132 in FIG. 6) of the lead section 106 are exposed. Preferably, an entire circumference, and additionally a bottom surface 116, of the lead bodies 118 is exposed with regard to the encapsulant 110.

As a result of the described manufacturing process and in particular thanks to the curved foil 156, also an entire circumferential sidewall portion (see sidewalls 136) as well as a complete bottom surface 116 of the mounting section 104 are exposed with regard to the encapsulant 110.

FIG. 3 illustrates the electronic device 150 composed of a mounting base 152 (such as a printed circuit board, PCB, or a ceramic substrate) and the leadless package 100 according to FIG. 2 mounted thereon. It will be described in the following how, starting from the structure shown in FIG. 2, the electronic device 150 may be manufactured.

After removing the foil 156 from the structure shown in FIG. 2, the entire bottom surface 116' of the encapsulant 110 is in a raised positon with regard to the downwardly protruding entire bottom surface 116 of the carrier 102. The exposed bottom surface 116' of the encapsulant 110 has a uniform height level. As can be taken from FIG. 3, a ratio between a height, l, up to which the interior sidewall 112 of the lead section 106 is exposed with regard to the encapsulant 110 on the one hand, and a uniform thickness L of the carrier 102 on the other hand may be for instance 25%.

After removal of foil 156, the leadless package 100 is soldered onto the mounting base 152 by a solder-type coupling structure 154. More precisely, a solder paste (as a preform of the coupling structure 154) may be applied on a connection surface of the mounting base 152, and the leadless package 100 may be attached onto the solder paste on the mounting base 152. As a result, the shown electronic device 150 is obtained. The coupling structure 154 electrically and mechanically couples the exposed and protruding portions of the carrier 102 with the mounting base 152 so that the coupling structure 154 contacts the entire circumferential sidewalls 112, 114, etc. as well as the entire bottom surface 116 of the lead bodies 118 of the lead section 106 as well as the entire circumferential sidewalls 136 and the entire bottom surface 116 of the mounting section 104.

After the described board mounting procedure, the lead bodies 118 of the lead section 106 as well as the mounting section 104 are surrounded by cup-shaped solder portions of the coupling structures 154, thereby obtaining an enhanced board level reliability. A detail 193 in FIG. 3 illustrates that, after board mounting, the shown lead body 118 is provided with a surrounded solder wetting.

Due to the high connection area between the solder-type coupling structure 154 on the one hand and the exposed sidewalls 112, 114, 136 and bottom surface 116 of the lead section 106 as well as of the mounting section 104, a reliable electrical and mechanical connection between the leadless package 100 and the mounting base 152 is obtained which is capable of withstanding thermal load.

As a result, the conventional shortcoming of leadless packages often suffering from severe solder degradation when thermally cycled on board compared to packages with leads, can be overcome with simple measures according to exemplary embodiments. The mentioned conventional shortcoming is due to a missing—in case of conventional leadless packages—spring-like effect of the leads of a leaded package which buffers a certain amount of mismatch in thermal expansion between board and package. This main root cause for solder degradation of conventional leadless packages during thermal cycling can be overcome by the embodiment of FIG. 1 to FIG. 3. By the large contact area between the exposed surface portions (see reference numerals 112, 114, 116, 136) of the carrier 102 on the one hand and the coupling structure 154 on the other hand, the leadless package 100 according to the shown embodiment is capable of withstanding even a considerable amount of mismatch in thermal expansion between the leadless package 100 and the mounting base 152 without being damaged.

An improvement obtained by exemplary embodiments relates to the creation of a molding compound stand-off at the package bottom so that the die pad or mounting section 106 and the lead bodies 118 of lead section 104 stand out. Thereby, the board solder or coupling structure 154 has the opportunity to build up a solder fillet in particular at all four sidewalls 112, 114, etc. of the lead bodies 118. Additionally, etched lead edges may lead to a larger solder volume on the package side of the lead bodies 118, where the solder loading may be highest. Beneath the lead bodies 118, only a thin solder volume may be sufficient, for instance with the same thickness as solder between lead and copper pad.

Simulations described below confirm the improved thermal cycling performance of leadless packages 100 and corresponding electronic devices 150 according to exemplary embodiments. A leadless package 100 of the type shown in FIG. 4 is used as an example in these simulations.

Figure 4:
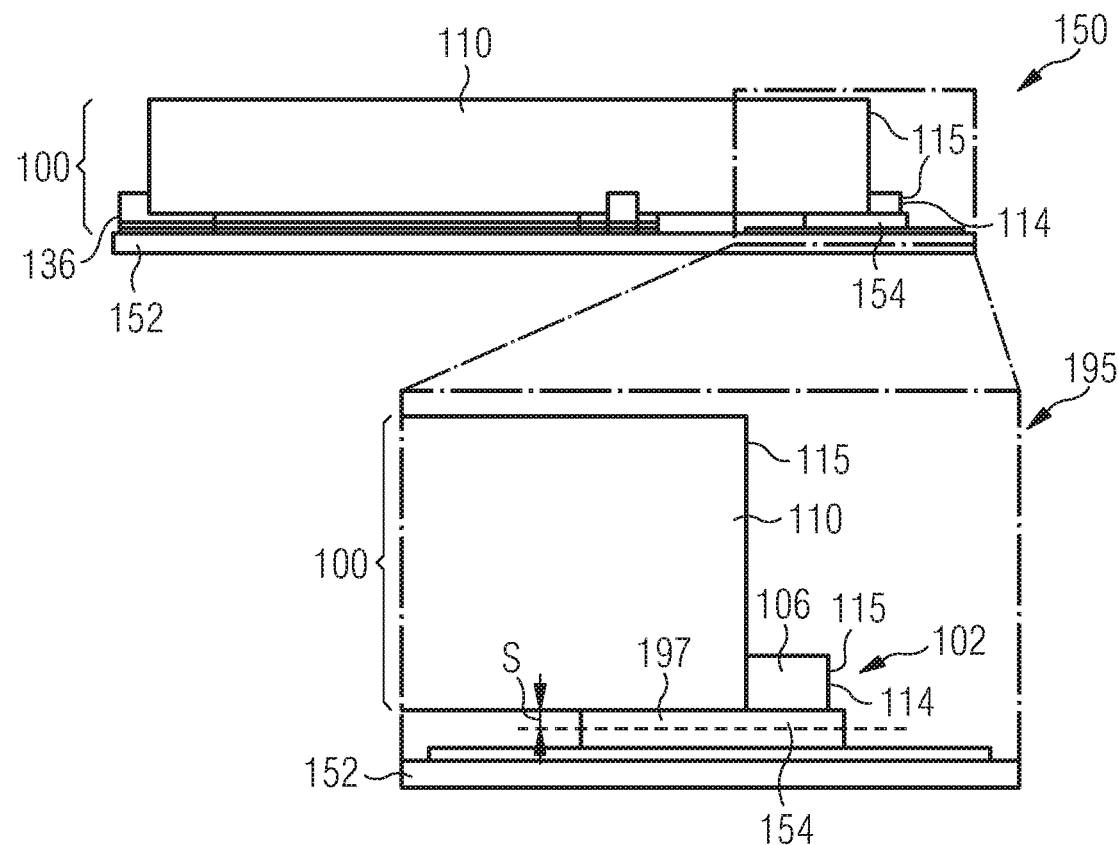
FIG. 4 shows a cross-sectional view and a detail of an electronic device implementing a leadless package used as a basis for a simulation.
Figure 5:
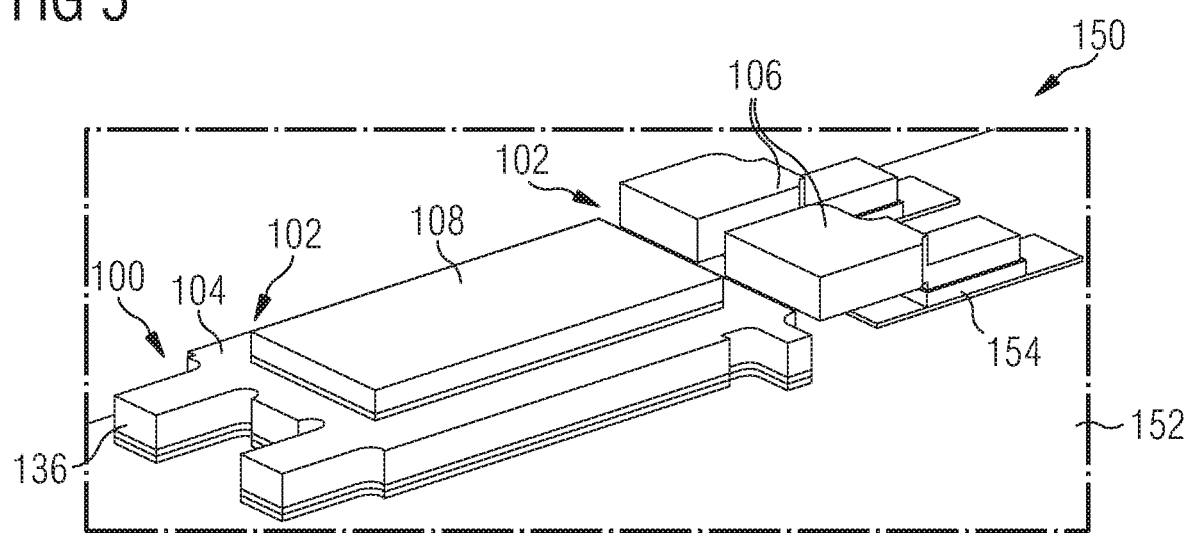
FIG. 5 shows a three dimensional view of an electronic device of the type shown in FIG. 4.

FIG. 4 shows a cross-sectional view and a detail 195 of an electronic device 150 implementing a leadless package 100 which is used as the basis for the simulation. FIG. 5 shows a corresponding three dimensional view of the electronic device 150 of the type shown in FIG. 4. A solder fillet (see reference numeral 197 in FIG. 4) is here present, according to an exemplary embodiment, on all sides of the lead bodies 118. For instance, a stand-off, s, of the encapsulant 110 of 80 µm may be used.

Figure 6:
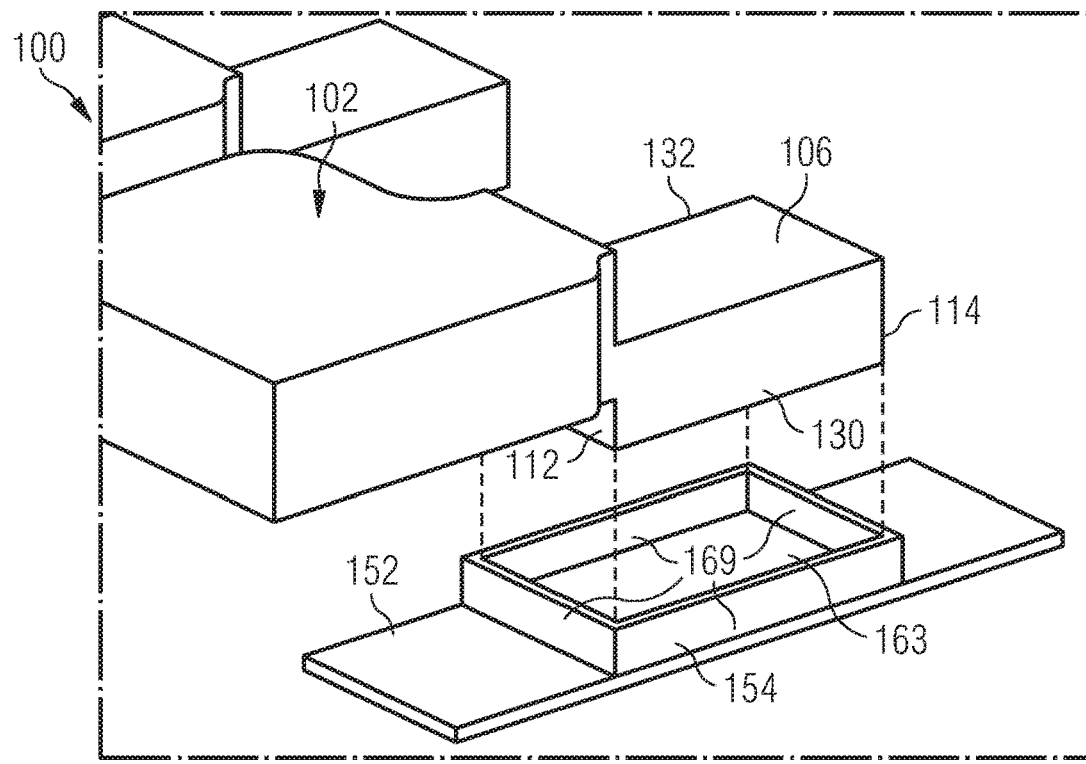
FIG. 6 shows an exploded view of a part of an electronic device according to an exemplary embodiment.
Figure 7:
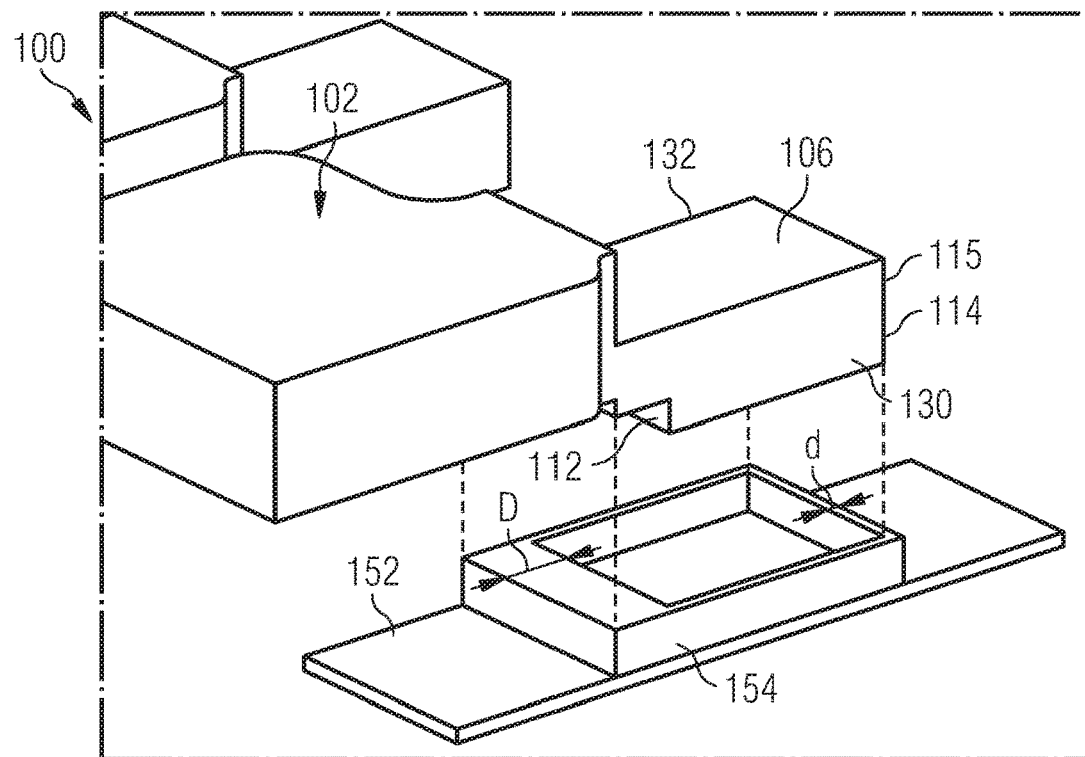
FIG. 7 shows an exploded view of part of an electronic device according to another exemplary embodiment.

For the simulation, the performance of a conventional electronic device 209 with a leadless package 210 without exposed interior sidewall (compare FIG. 8) is compared with a performance of electronic devices 150 with leadless packages 100 according to the two exemplary embodiments shown in FIG. 6 and FIG. 7.

In the exploded view of the embodiment of FIG. 6, the encapsulant 110 (not shown) only partially encapsulates the carrier 102 so that parts of all four sidewalls 112, 114, 130, 132 of the lead section 106 are exposed. Due to mold compound stand-off at the bottom of the package 100, the board solder or coupling structure 154 can build up a solder fillet on all four lateral sides of the lead bodies 118 of the lead section 106. According to FIG. 6, the coupling structure 154 has thus an annular section 169 which fully circumferentially contacts all exposed sidewalls 112, 114, 130, 132 of the lead section 106. This annular section 169 is connected with a planar base layer 163 to thereby form a cup-shaped coupling structure 154.

In the exploded view of the alternative embodiment of FIG. 7, a thickness, D, of the coupling structure 154 in a lateral direction is larger at the interior sidewall 112 of the lead section 106 as compared to a thickness, d, at the exterior sidewall 114 of the lead section 106 and compared to thicknesses at the remaining two other sidewalls 130, 132 of the lead section 106. According to FIG. 6, the circumferential lateral thickness of the sidewalls 112, 114, 130, 132 is identical (in particular d). Again referring to FIG. 7, a removed edge at the package side of the leads allows the board solder to build up a larger solder volume at the place where solder fatigue is highest for the leadless package 100.

Figure 8:
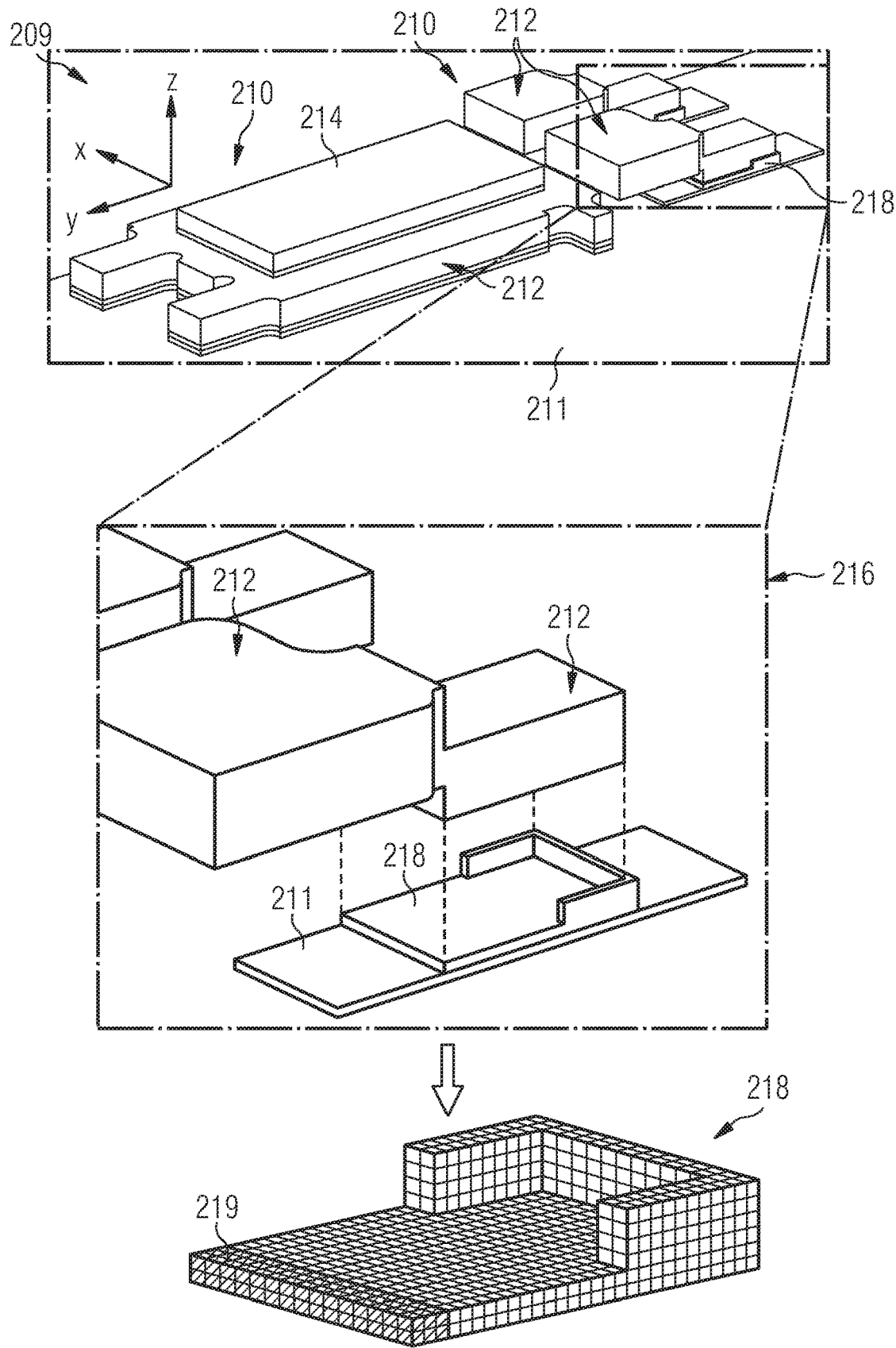
FIG. 8 illustrates an overview and a detail of a conventional electronic device.

FIG. 8 illustrates an overview and a detail 216 of the above-mentioned conventional electronic device 209.

The conventional electronic device 209 composed of printed circuit board 211 and package 210 shown in FIG. 8 comprises a leadframe 212 with a semiconductor chip 214 mounted thereon. The detail 216 in FIG. 8 shows that only a small portion of the sidewalls of the leadframe 212, excluding in particular an interior sidewall thereof, are used for being contacted to solder 218. Moreover, a control volume 219 of the solder 218 is shown in FIG. 8 which will be used for comparison purposes of the simulation results.

Figure 9:
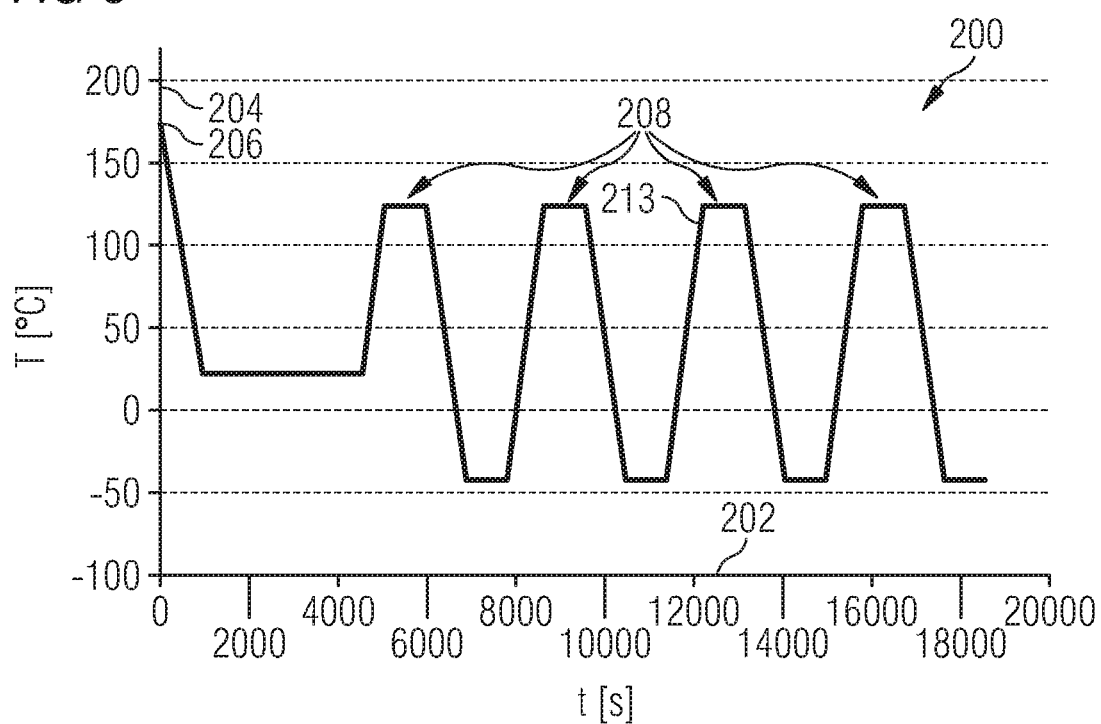
FIG. 9 illustrates a diagram showing a dependence between temperature and time according to a simulation.

FIG. 9 shows a diagram 200 having an abscissa 202 along which the time, t, is plotted in seconds (s). Along an ordinate 204 of the diagram 200, the temperature, T, is plotted in degree Celsius. FIG. 9 illustrates a curve 213 being indicative of a temperature profile used for the simulations, i.e. temperature cycles applied to simulated leadless packages 100 according to FIG. 6 and FIG. 7 and to the conventional leadless package 210 according to FIG. 8.

More specifically, the following temperature profile was used for the simulations:
  start stress free at 175° C. (compare reference numeral 206)
  apply several temperature cycles (compare reference numeral 208) between −40° C. and 125° C. with 15 minutes ramp and 15 minutes dwell time.

Figure 10:
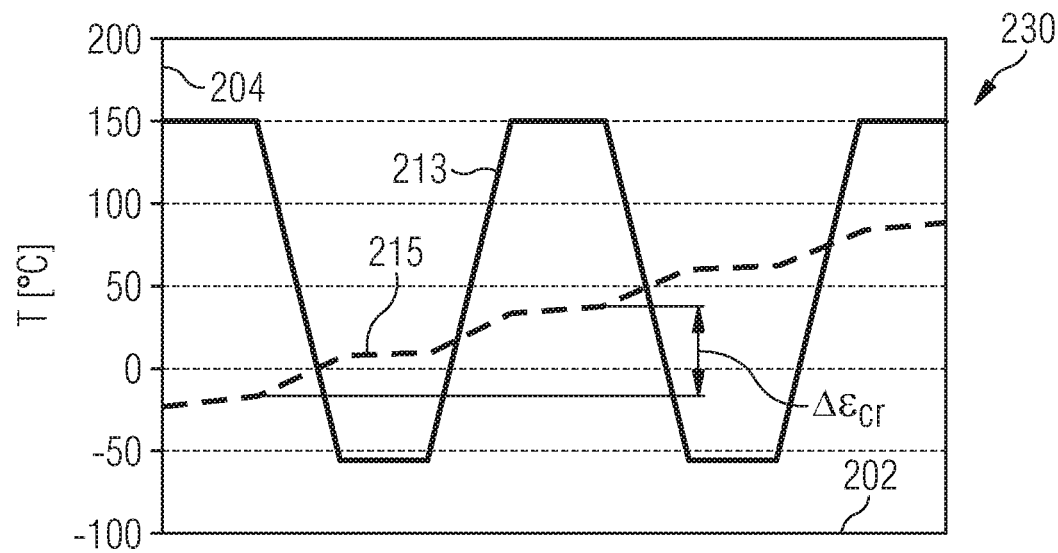
FIG. 10 illustrates a diagram showing a dependence between temperature and time according to the simulation and showing how to derive data indicative of a creep strain increment.

FIG. 10 shows a diagram 230 corresponding to the diagram 200 and showing a result of the simulation. More specifically, the diagram 230 shows a dependence between temperature and time according to a simulation of the conventional electronic device 209 of FIG. 8. Apart from curve 213 described above referring to FIG. 9, the diagram 230 additionally shows development of accumulated creep strain (see creep strain increment $\Delta\varepsilon_{cr}$) in a further curve 215.

Figure 11:
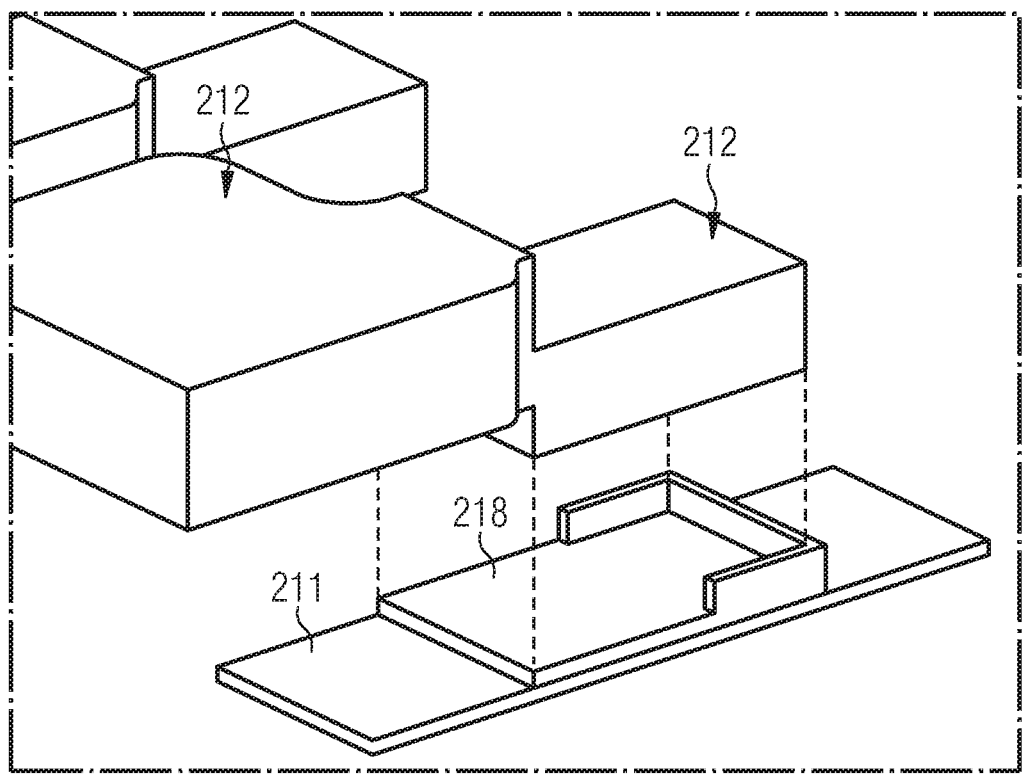
FIG. 11 illustrates a detail of the conventional electronic device of FIG. 8.
Figure 11:
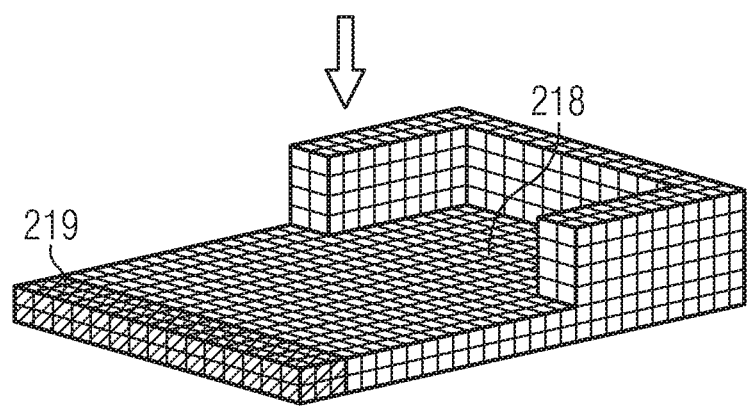

Loading of the solder is highest at the package side of the outer leads for many leadless packages, so solder degradation can be reasonably assumed to start there. Therefore, control volume 219 in this position is used for evaluation of solder fatigue. The size and meshing of the control volumes 219 of the conventional embodiment of FIG. 8 (compare additionally FIG. 11) and of the exemplary embodiments of FIG. 6 (compare additionally FIG. 12) and FIG. 7 (compare additionally FIG. 13) is exactly the same. More specifically:

FIG. 11 illustrates a detail of the conventional electronic device 209 of FIG. 8 and specifically illustrates the shape of the solder 218 as well as the shape and position of the control volume 219.

Figure 12:
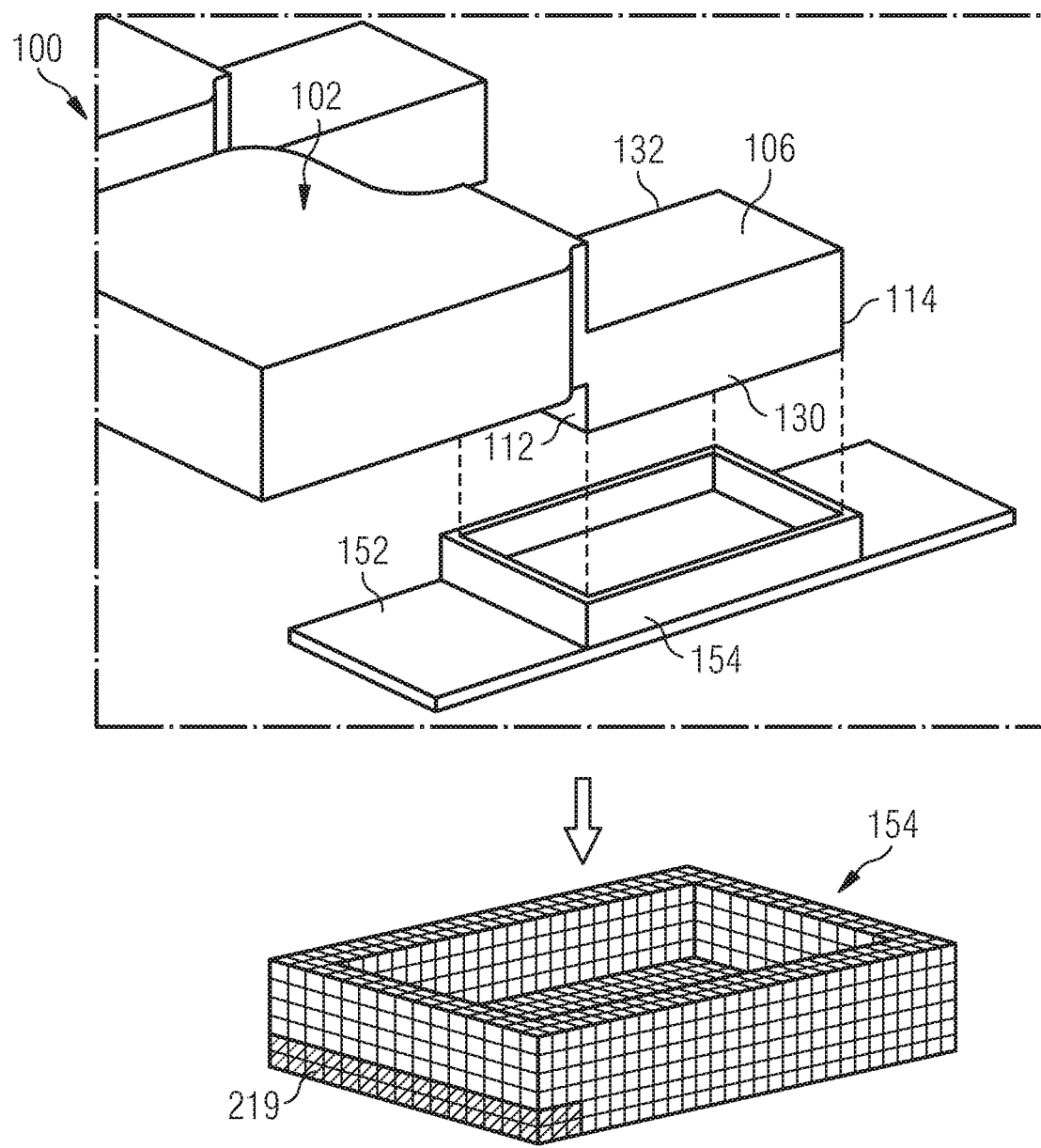
FIG. 12 illustrates a detail of an electronic device according to an exemplary embodiment.

FIG. 12 illustrates a detail of the electronic device 150 according to FIG. 6 and specifically illustrates the shape of the coupling structure 154 as well as the shape and position of the control volume 219.

Figure 13:
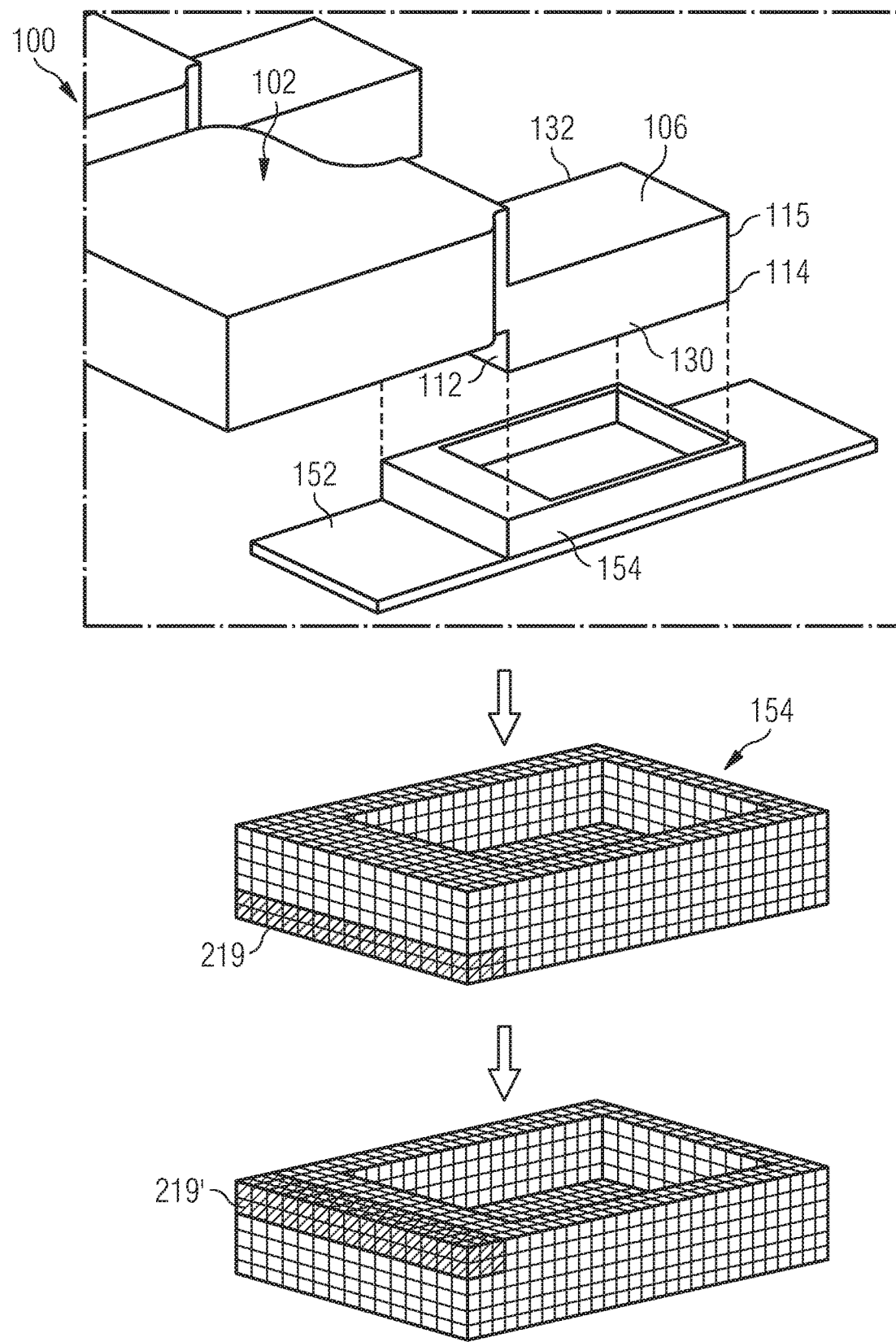
FIG. 13 illustrates a detail of an electronic device according to another exemplary embodiment.

FIG. 13 illustrates a detail of the electronic device 150 according to FIG. 7 and specifically illustrates the shape of the coupling structure 154 as well as the shape and position of the control volume 219 and of a further control volume 219'.

The creep strain increment $\Delta\varepsilon_{cr}$ of one thermal cycle is averaged over the control volumes 219 and serves as damage parameter for relative comparison, higher accumulation of creep strain indicating higher solder degradation.

In order to achieve best comparability of the three cases, the solder volumes are meshed identically and the accumulated creep strain of the board solder is evaluated in exactly matching control volumes 219.

The control volumes 219 are located at the bottom of the package side of the board solder volumes as there can be the highest loading of the solder. For the embodiment of FIG. 7 also additional control volume 219' at the top of the board solder volume is evaluated for comparison.

Figure 14:
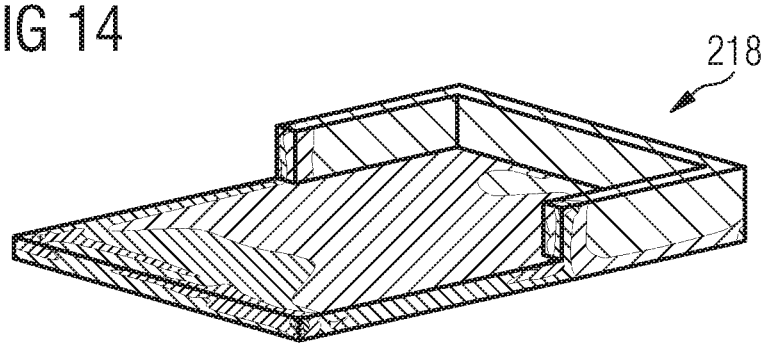
FIG. 14 to FIG. 16 show results of thermal stress simulations of the conventional electronic device of FIG. 11 (see FIG. 14), the embodiment of FIG. 12 (see FIG. 15) and the embodiment of FIG. 13 (see FIG. 16), respectively.
Figure 15:
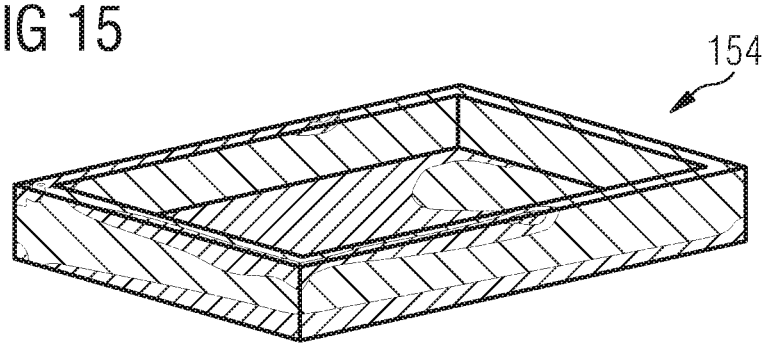
Figure 16:
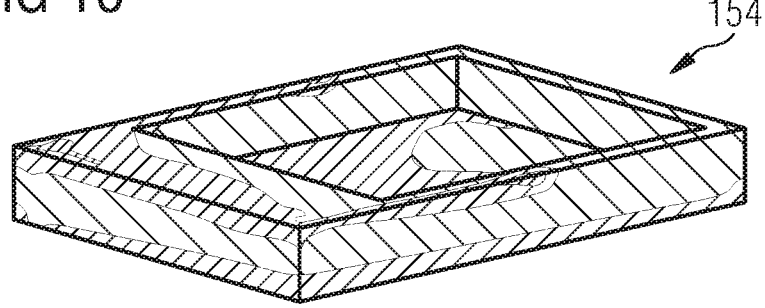

FIG. 14 to FIG. 16 show results of the stress simulations of the conventional electronic device 209 of FIG. 8 and FIG. 11 (see FIG. 14), the embodiment of FIG. 6 and FIG. 12 (see FIG. 15) and the embodiment of FIG. 7 and FIG. 13 (see FIG. 16), respectively.

The results for the accumulated creep strain in the control volumes 219, i.e. in the respective board solder volume of the outer lead at end of simulation are as follows: The highest loading of the solder indicated by the largest amount of accumulated creep strain is positioned at the package side of the outer lead for the configuration shown in FIG. 14. The accumulated creep strain in this area is clearly reduced by the measures taken in the embodiment of FIG. 6 (i.e. circumferential sidewalls of the lead section 106 covered by uniformly thick material of coupling structure 154) and FIG. 7 (i.e. circumferential sidewalls of the lead section 104 covered by material of coupling structure 154, and additionally rendering solder thickness larger close to the interior sidewall 112).

Assuming that a solder fatigue crack would probably start at the area with highest accumulated creep strain and would then propagate beneath the lead, the improvement measures according to FIG. 6 and FIG. 7 may significantly improve the thermal cycling performance of the respective leadless package 100. Hence, FIG. 14 to FIG. 16 can be compared to illustrate the advantageous technical effects of exemplary embodiments. In the case of the conventional package to which the simulation shown in FIG. 14 refers, high mechanical load occurs during the simulation. With the two exemplary embodiments shown in FIG. 15 and FIG. 16, the corresponding stress can be significantly reduced.

Figure 17:
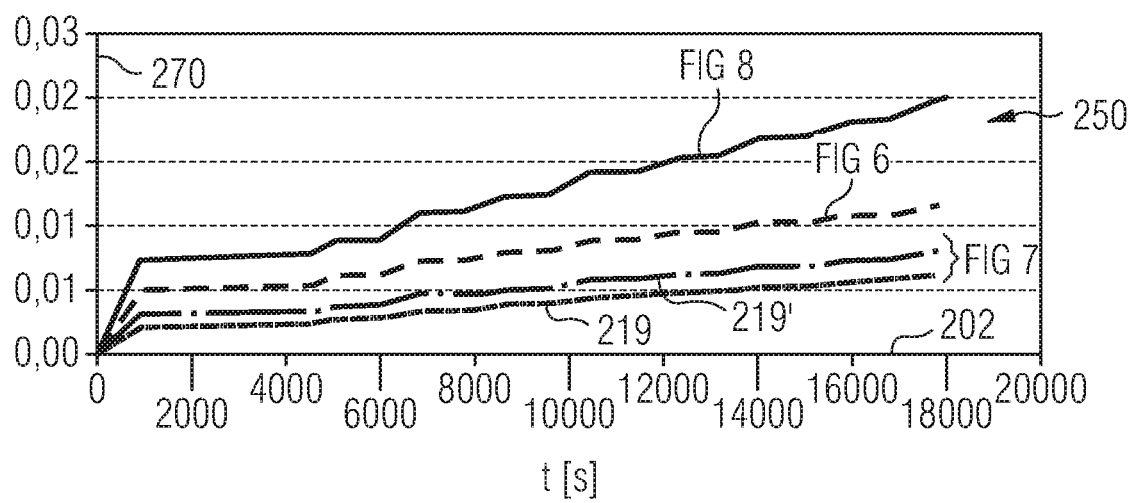
FIG. 17 and FIG. 18 show diagrams indicating an improved board level reliability of the embodiments of FIG. 12 and FIG. 13 compared to the conventional electronic device according to FIG. 11.
Figure 18:
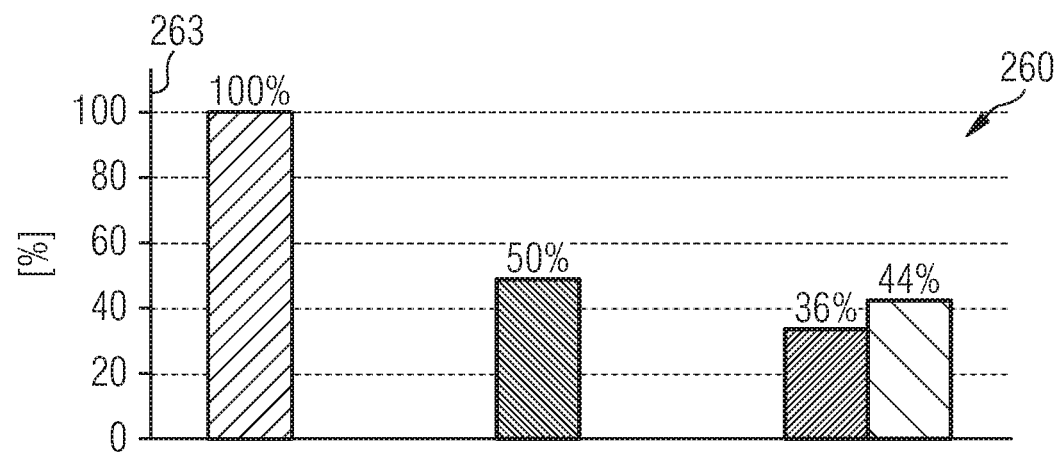

FIG. 17 and FIG. 18 show diagrams 250, 260 indicating an improved board level reliability of the embodiments of FIG. 12 and FIG. 13 compared to the conventional electronic device 209 according to FIG. 11.

Diagram 250 in FIG. 17 has an abscissa 202 along which the time is plotted in seconds. Along an ordinate 270, the accumulated creep strain is plotted. FIG. 17 illustrates an accumulation of creep strain (volume averaged over control volumes 219, 219') during simulation.

FIG. 18 illustrates in bar diagram 260 that, when the conventional package is set to a damage value (see ordinate 263) of 100%, the above described exemplary embodiments significantly improve this damage parameter to 50% (see the embodiment of FIG. 6), or even 36% (see the embodiment of FIG. 7, control zone 219) or 44% (see the embodiment of FIG. 7, control zone 219'). Thus, the accumulated creep strain of the simulated thermal cycle as damage parameter shows a decrease of 50% by the embodiment of FIG. 6 and even a further decrease of the damage parameter by the embodiment of FIG. 7. These results clearly indicate a significant improvement of thermal cycling performance. FIG. 18 illustrates an accumulation of creep strain (volume averaged over control volumes 219, 219') during the last thermal cycle.

Figure 19:
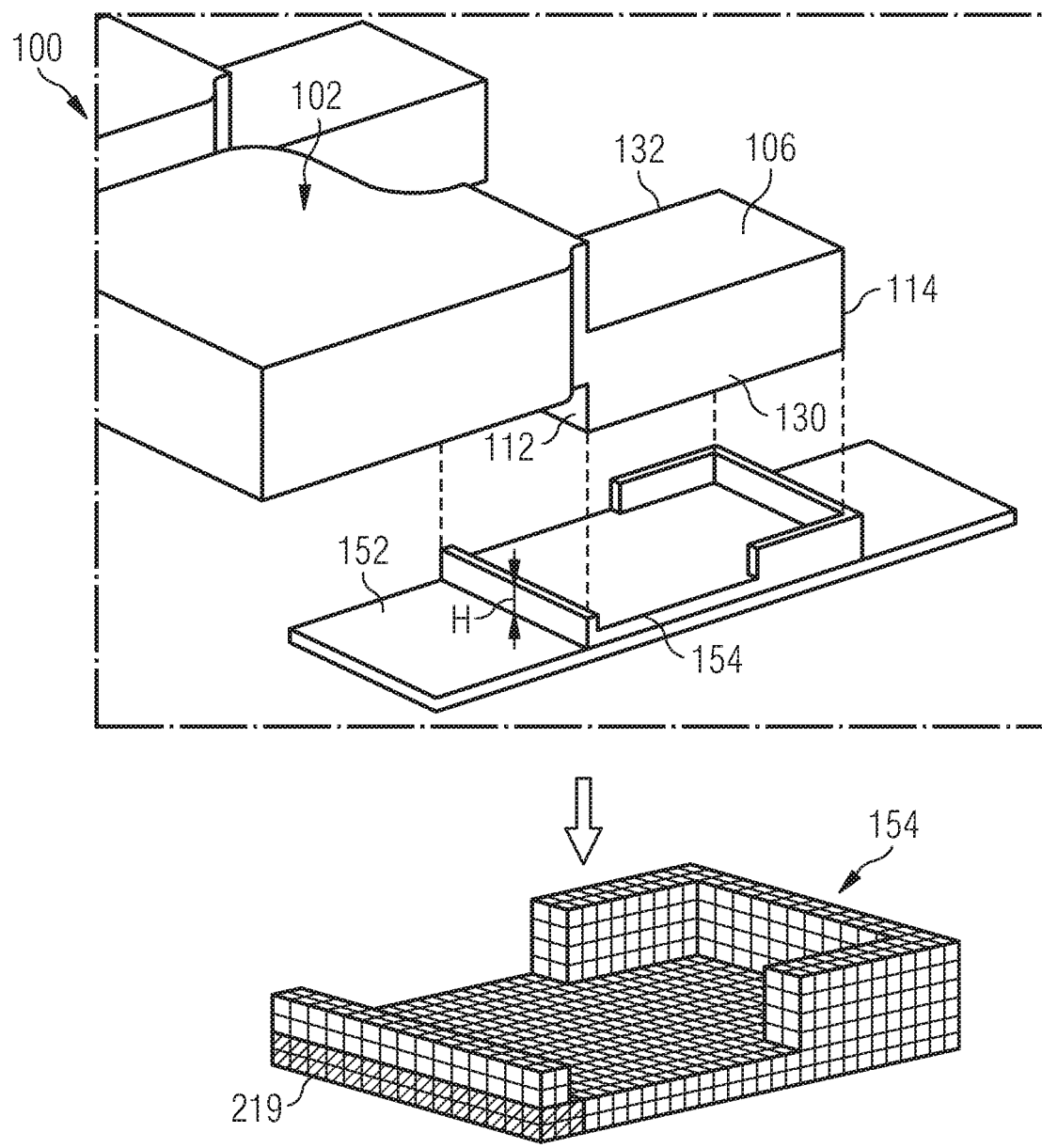
FIG. 19 illustrates a detail of an electronic device according to an exemplary embodiment having a first height of an interior sidewall of a coupling structure.

FIG. 19 illustrates a detail of an electronic device 150 according to an exemplary embodiment. According to FIG. 19, an exposed portion of the interior sidewall 112 and a corresponding wall of the coupling structure 154 has a height H of 40 µm. Accordingly, the package sides of the leads are exposed by a groove at the package bottom, so that the board solder can build up a solder fillet on the package side of the leads.

Figure 20:
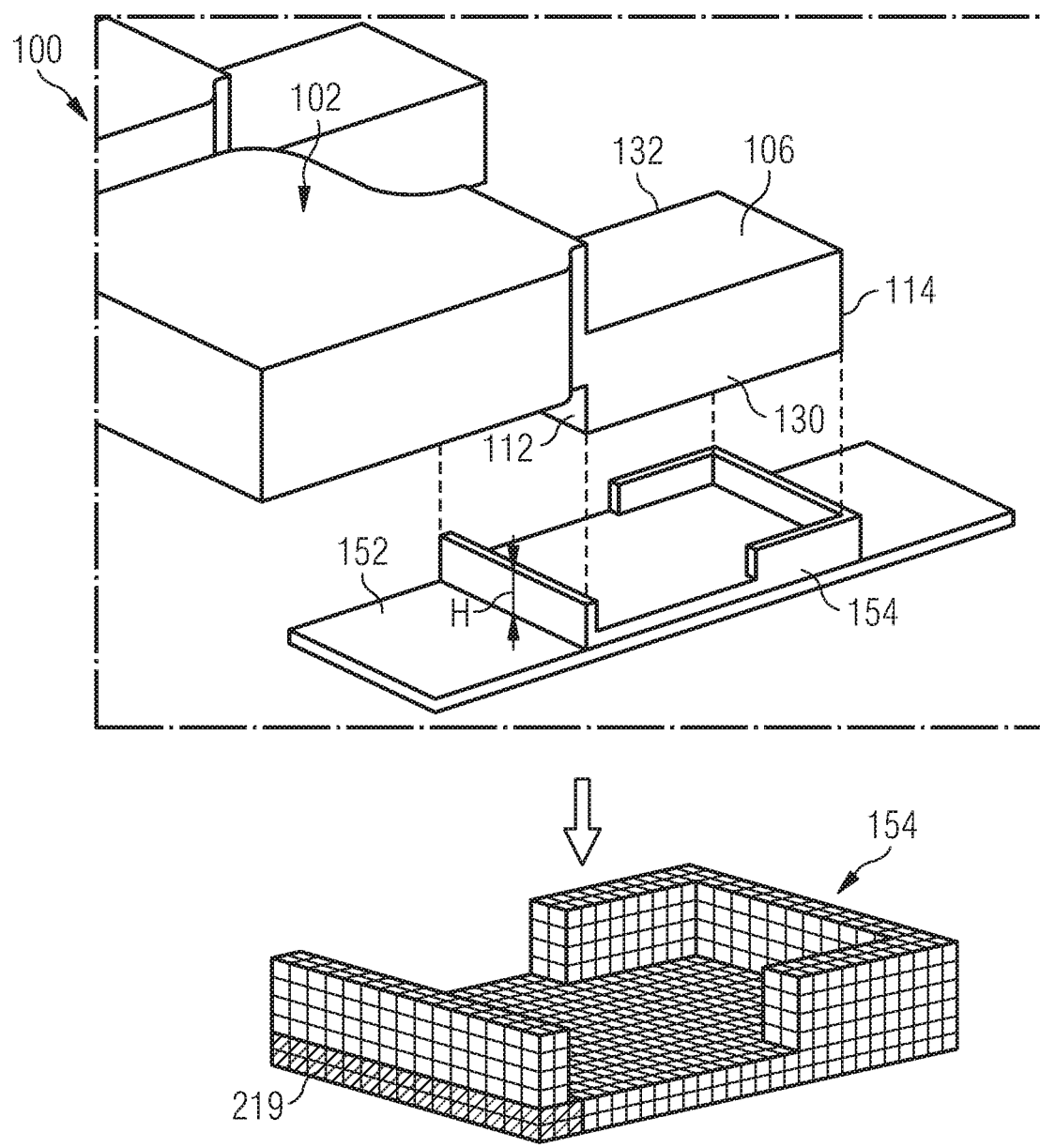
FIG. 20 illustrates a detail of an electronic device according to another exemplary embodiment having a second height of an interior sidewall of a coupling structure larger than the first height according to FIG. 19.

FIG. 20 illustrates a detail of an electronic device 150 according to another exemplary embodiment having an exposed section of sidewall 112 corresponding to a height H of 80 µm. The groove depth and thereby the solder fillet height at the package side of the leads is hence increased, in comparison with FIG. 19, from 40 µm to 80 µm to assess the impact of the groove depth.

A corresponding simulation as described above has also been carried out for comparing the exemplary embodiments of FIG. 19 and FIG. 20 with the conventional electronic device 209 of FIG. 8. Next, a creep strain average in control volumes 219 will be discussed for the three cases.

Figure 21:
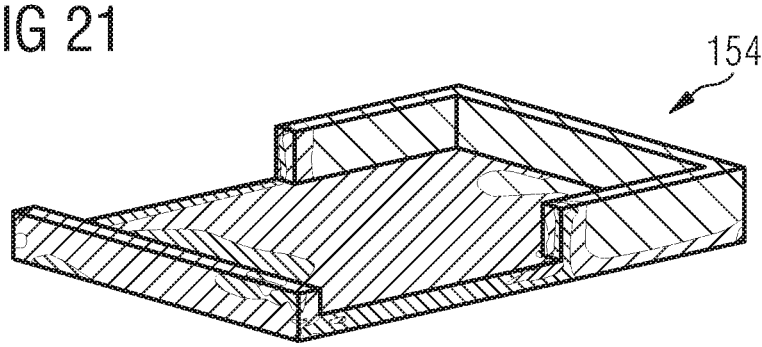
FIG. 21 and FIG. 22 show results of stress simulations of the embodiment of FIG. 19 (see FIG. 21) and the embodiment of FIG. 20 (see FIG. 22), respectively.
Figure 22:
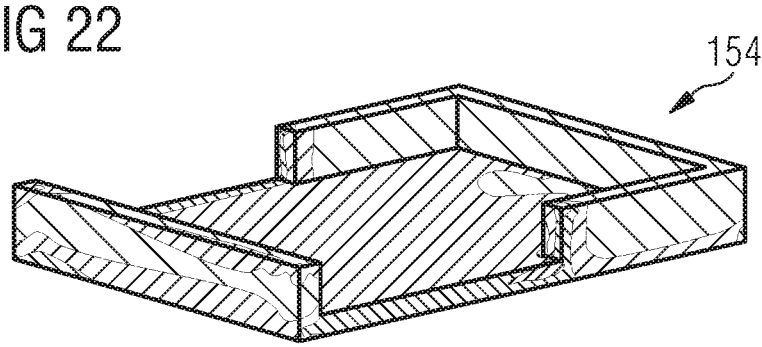

FIG. 21 and FIG. 22 show results of the mentioned stress simulations of the embodiment of FIG. 19 (see FIG. 21) and the embodiment of FIG. 20 (see FIG. 22), respectively. Thus, results for accumulated creep strain in the control volumes 219 are shown. More specifically, the accumulated creep strain in the board solder volume of the outer lead at the end of the simulation is displayed in FIG. 21 and FIG. 22.

The highest loading of the solder 218 indicated by the largest amount of accumulated creep strain is positioned at the package side of the outer lead for the configuration according to FIG. 14. As shown in FIG. 21 and FIG. 22, respectively, the accumulated creep strain in this area is clearly reduced by the measures according to FIG. 19 and FIG. 20, respectively.

Assuming that a solder fatigue crack would likely start at the area with highest accumulated creep strain and would then propagate beneath the lead, the measures taking according to FIG. 21 and FIG. 22 may significantly improve the thermal cycling performance of the corresponding leadless packages 100.

Figure 23:
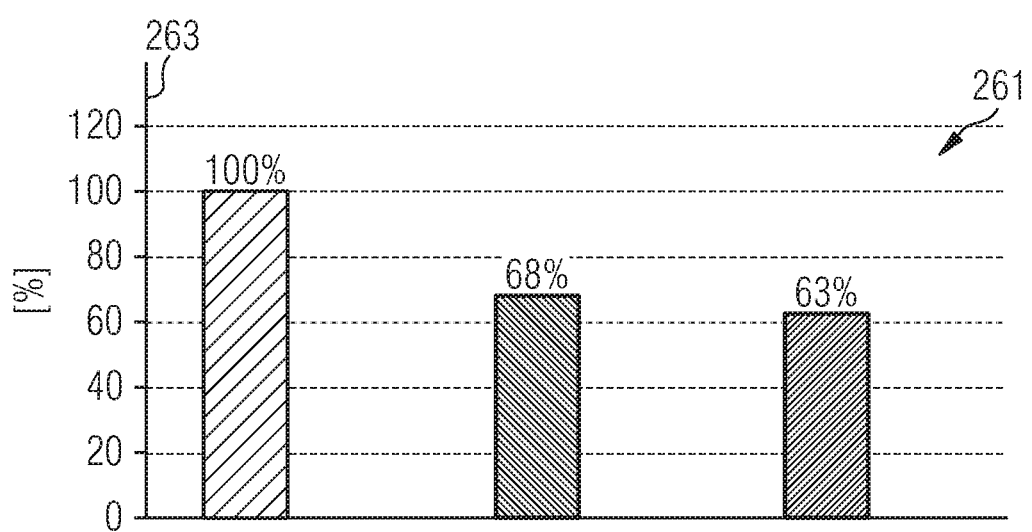
FIG. 23 shows a diagram indicating an improved board level reliability of the embodiments of FIG. 19 and FIG. 20 compared to a conventional electronic device.

FIG. 23 shows a bar diagram 261 indicating an improved board level reliability of the embodiments of FIG. 19 and FIG. 20 compared to the conventional electronic device 209 as shown in FIG. 8. A corresponding damage parameter is plotted along ordinate 263. The shown damage parameter of 100% corresponds to the conventional electronic device 209, the damage parameter of 68% corresponds to the embodiment according to FIG. 19, and the damage parameter of 63% corresponds to the embodiment according to FIG. 20. Accumulated creep strain of the last simulated thermal cycle as damage parameter shows a decrease of about one third, wherein the increase of the groove depth from 40 µm to 80 µm provides a slight further improvement. Concluding, the results clearly indicate a significant improvement of thermal cycling performance when exposing the interior sidewalls 112 of the lead section 106 up to a sufficient height H.

The bar diagram 261 in FIG. 23 shows that increasing the height H of the portion of the interior sidewall 112 of the lead section 106 of the leadless package 100 contacting the coupling structure 154 further reduces the probability that the corresponding package 100 suffers from damage during thermal cycling or when being exerted to mechanical load. However, a significant improvement of reliability can be surprisingly obtained already by a moderate height H of about 40 µm.

Figure 24:
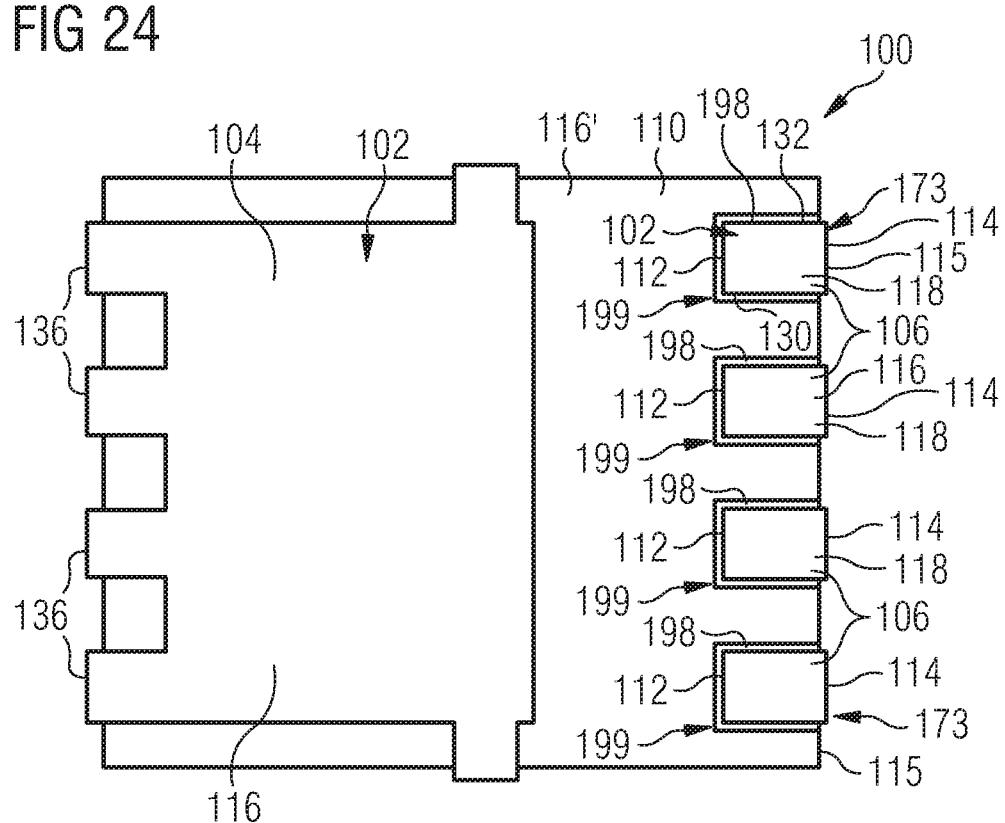
FIG. 24 illustrates a plan view of a leadless package according to an exemplary embodiment.

FIG. 24 illustrates a plan view of a leadless package 100 according to an exemplary embodiment.

In the shown embodiment, a bottom surface 116' of the encapsulant 110 has a plurality of recesses 198 (extending into the paper plane of FIG. 24). Each of the recesses 198 partially exposes the interior sidewall 112 (facing away from exterior sidewall 114 and being oriented parallel to exterior sidewall 114) as well as interior sidewalls 130, 132 (being directly connected to exterior sidewall 114 and being oriented perpendicular to exterior sidewall 114 and interior sidewall 112) of a respective one of the four lead bodies 118 on the right hand side of FIG. 24. Each of the substantially C-shaped recesses 198 partially surrounds an assigned one of the lead bodies 118 individually. Together with the exposed exterior sidewall 114 of the lead bodies 118 which also form part of the exterior sidewall 115 and consequently the exterior lateral outline of the entire package 100, a circumferentially closed annular exposed sidewall area of the lead bodies 118 is obtained. In other words, all three interior sidewalls 112, 130, 132 located inside of an exterior lateral outline of the package 100 are exposed in addition to exterior sidewall 114 (which forms part of the exterior lateral outline of the package 100) of the lead section 106. The recesses 198 are formed so that spaces between at least partially exposed sidewalls 130, 132 of the lead bodies 118 remain filled with material of the encapsulant 110. In the shown embodiment, four lead bodies 118 of lead section 106 of carrier 102 are configured as heeled leads for improving the mechanical and electrical reliability of the illustrated leadless package 100. In order to form these heeled leads, laser cutting can be carried out selectively in regions indicated by reference numeral 199 for generating protruded leads. For example, a width of a substantially C-shaped or U-shaped groove or recess 198 around a respective lead body 118 within the paper plane of FIG. 24 may be 0.2 mm, and a depth of the groove or recess 198 perpendicular to the paper plane of FIG. 24 may be 0.1 mm. More generally, both the groove width and the groove depth may be in a range between 40 µm and 1000 µm. Removing material of the encapsulant 110 at the three interior sidewalls 112, 130, 132 of the respective lead body 118 of the lead section 106 for example by laser cutting (alternatively by a chemical treatment such as etching or by a mechanical treatment such as milling or drilling) will generate a circumferentially closed annular recess around the respective lead body 118 so that a circumferentially closed contact or wetting by a coupling structure 154 (for instance solder) may be achieved.

According to FIG. 24, material removal of the encapsulant 110 has been made such that a C-shaped or U-shaped groove or recess 198 is formed around the respective lead body 118, thereby exposing an entire circumferential sidewall annulus (see reference numerals 112, 114, 130, 132) of each of the lead bodies 118.

With regard to FIG. 24, a simulation result should be mentioned which also applies to other embodiments. It has namely turned out the lead bodies 118 located in a corner of the package 100, as indicated by reference numeral 173, are specifically prone to failure in the presence of thermal load. Thus, it may be advantageous, in terms of a quick and simple manufacturing process, to only expose sidewalls 112, 114, 130, 132 of such lead bodies 118 which are located in a corner of the package 100 having a substantially rectangular outline.

Figure 25:
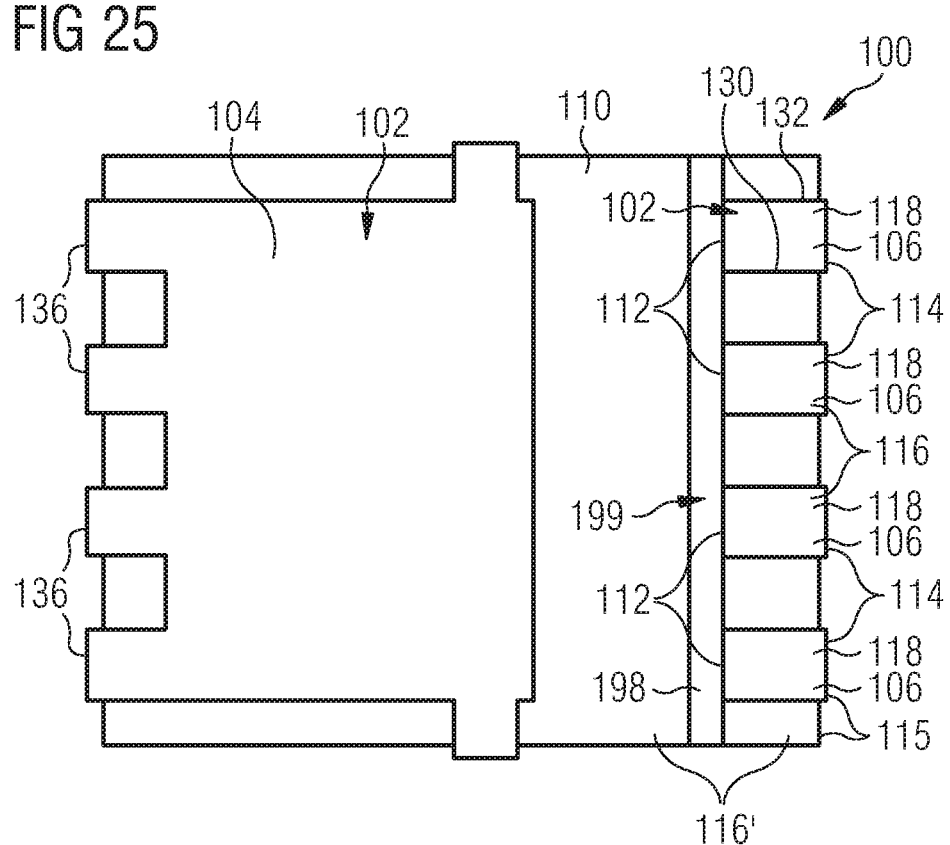
FIG. 25 illustrates a plan view of a leadless package according to another exemplary embodiment.

FIG. 25 illustrates a plan view of a leadless package 100 according to another exemplary embodiment. In this embodiment, a single recess 198 extends in the illustrates direction along all exposed interior sidewalls 112 of the four lead bodies 118 on the right hand side in common. In contrast to FIG. 24, the embodiment of FIG. 25 comprises a single straight groove or recess 198 formed by laser cutting in the encapsulant 110 to expose exclusively the interior sidewalls 112 (oriented in parallel to the exterior sidewalls 114) of the leadless package 100. Thus, an increase of board level reliability may be obtained with a very simple manufacturing process. It should however be emphasized that formation of the recess 198 does not necessarily have to be carried out by laser cutting. Alternatively, a corresponding material removal can be accomplished for example by a chemical treatment such as etching or by a mechanical treatment such as milling or drilling.

For example, a width of the straight groove or recess 198 in the paper plane of FIG. 25 may be 0.2 mm, and a groove depth perpendicular to the paper plane of FIG. 24 may be 0.1 mm. More generally, both the groove width and the groove depth may be in a range between 40 µm and 1000 µm.

Figure 26:
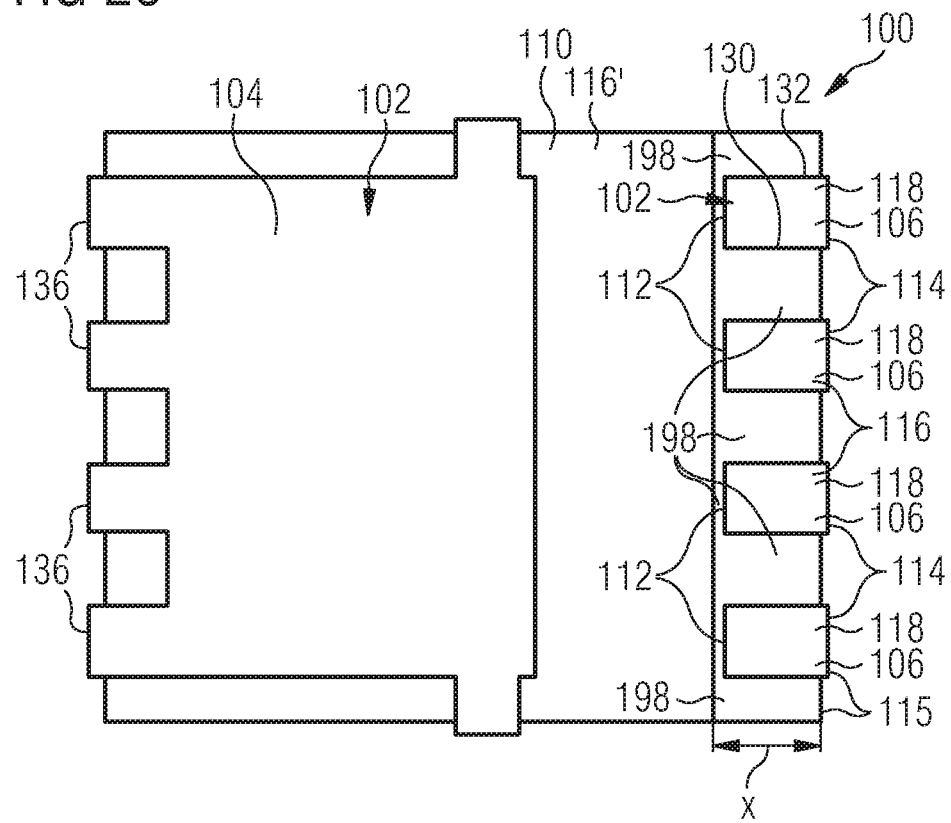
FIG. 26 illustrates a plan view of a leadless package according to still another exemplary embodiment.

FIG. 26 illustrates a plan view of a leadless package 100 according to still another exemplary embodiment. In this embodiment, a single common recess 198 exposes the four lead bodies 118 in common so that spaces between the exposed sidewalls 130, 132 of the lead bodies 118 are free of material of the encapsulant 110.

In FIG. 26, material of the encapsulant 110 has been removed along a rectangular area of the package 100 which covers all lead bodies 118 entirely and in common. As a result, the entire circumference of each of the lead bodies 118 is exposed. The rectangular area of the package 100 which has been made subject to a selective removal of material of the encapsulant 110 has a width x and extends along the entire length (or alternatively only around one single lead) of the package 100, as shown in FIG. 26. A person skilled in the art will understand that the rectangular shape of the package 100 is just an example, and that other shapes are possible in other exemplary embodiments. For instance, the protrusion of the lead bodies 118 beyond the encapsulant 110 in the region of the recess 198 may be 0.1 mm or more generally any value in a range between 40 µm and 1000 µm.

For forming the leadless package 100 according to FIG. 26, the following procedures may be carried out:
1. Laser cutting to form protruded leads
2. Frame etching after molding to protrude the leads.

Figure 27:
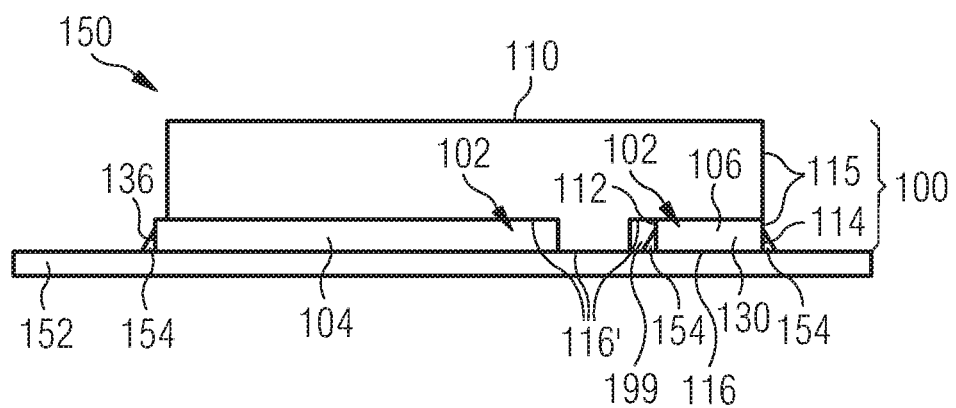

FIG. 27 illustrates a cross-sectional view of an electronic device 150 according to an exemplary embodiment corresponding to the plan view of the leadless package 100 of FIG. 26.

In order to manufacture the leadless package 100 of the electronic device 150 according to FIG. 27, material of the encapsulant 110 is removed (for instance by laser cutting, or chemically (for example by etching), or mechanically (for example by milling or drilling)), to thereby form the recess 198 to expose the interior sidewall 112 of the lead section 106. Due to the geometry of the heeled leads according to FIG. 27, exposed bottom surface 116' of the encapsulant 110 has a surface profile or topography. More specifically, an exposed bottom surface portion of the encapsulant 110 between the mounting section 104 and the lead section 106 comprises a step as a result of the material removal (for example by, but not limited to, laser cutting).

Additionally or alternatively to the partial removal of material of the encapsulant 110 for forming the recess 198, the method may also remove material of the carrier 102 by etching to thereby expose the sidewall 112 of the lead section 106.

Figure 28:
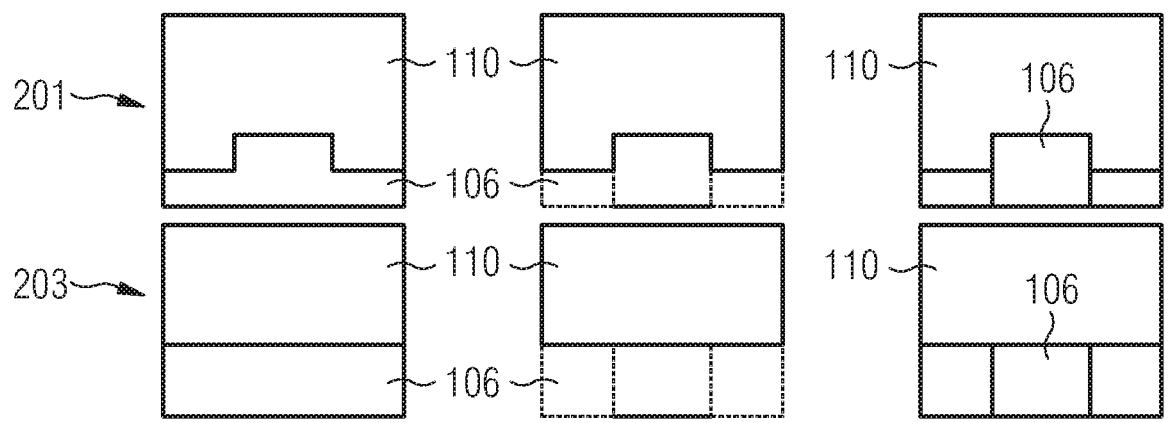
FIG. 28 illustrates details of the leadless package according to FIG. 26.

FIG. 28 illustrates details of the leadless package 100 of the electronic device 150 according to FIG. 27. An upper row 201 shows cross-sections of a respective front view of the leadless package 100. A bottom row 203 shows corresponding bottom views of the leadless package 100.

Figure 29:
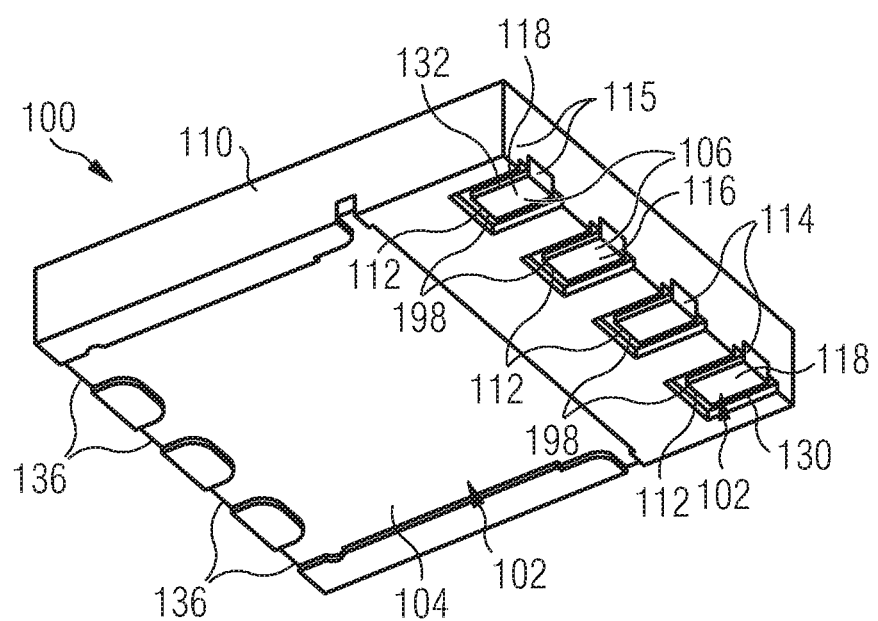
FIG. 29 illustrates a three dimensional view of the leadless package according to FIG. 24.

FIG. 29 illustrates a three dimensional view of the leadless package 100 according to FIG. 24. In this embodiment, a respective groove or recess 198 is formed separately and individually around each lead or lead body 118.

Figure 30:
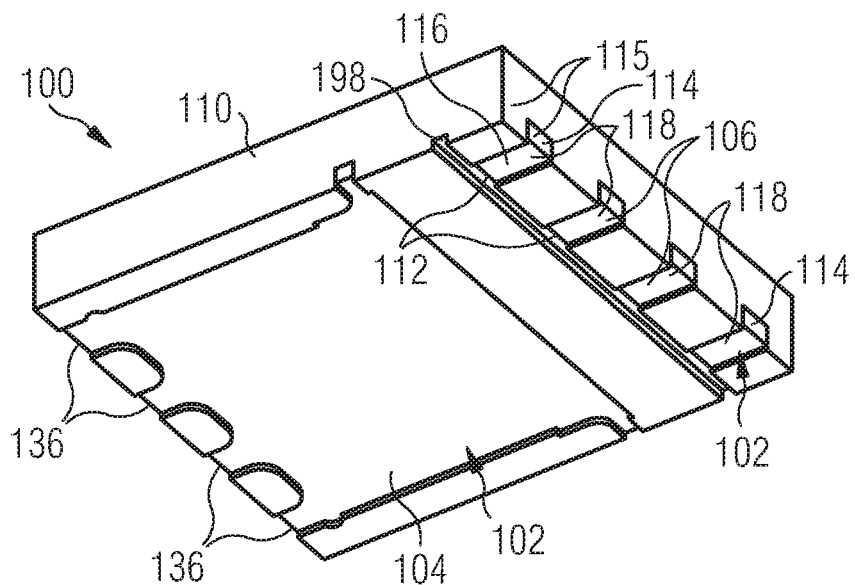
FIG. 30 illustrates a three dimensional view of the leadless package according to FIG. 25.

FIG. 30 illustrates a three dimensional view of the leadless package 100 according to FIG. 25. In this embodiment, a common straight groove or recess 198 is formed behind the leads or lead bodies 118.

Figure 31:
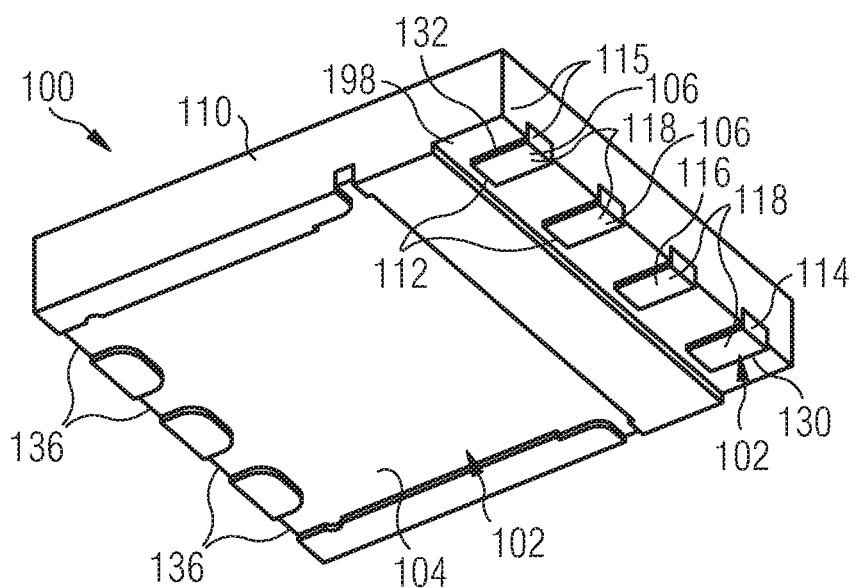
FIG. 31 illustrates a three dimensional view of the leadless package according to FIG. 26.

FIG. 31 illustrates a three dimensional view of the leadless package 100 according to FIG. 26. In this embodiment, material of the mold compound has been removed completely in the lead area to form a lateral step at a bottom of the encapsulant 110 and encompassing all lead bodies 118.

In each of the embodiments of FIG. 29 to FIG. 31, mold compound material of encapsulant 110 has been removed selectively at the package bottom around the lead bodies 118 of lead section 106 of the carrier 102 so that the sides of the leads are exposed for solder wetting. For instance, the depth of the grooves or recesses 198 may be 100 µm and their width may be 200 µm from lead sidewall, so that a solder fillet of 70 µm height and 100 µm width can be built up.

Figure 32:
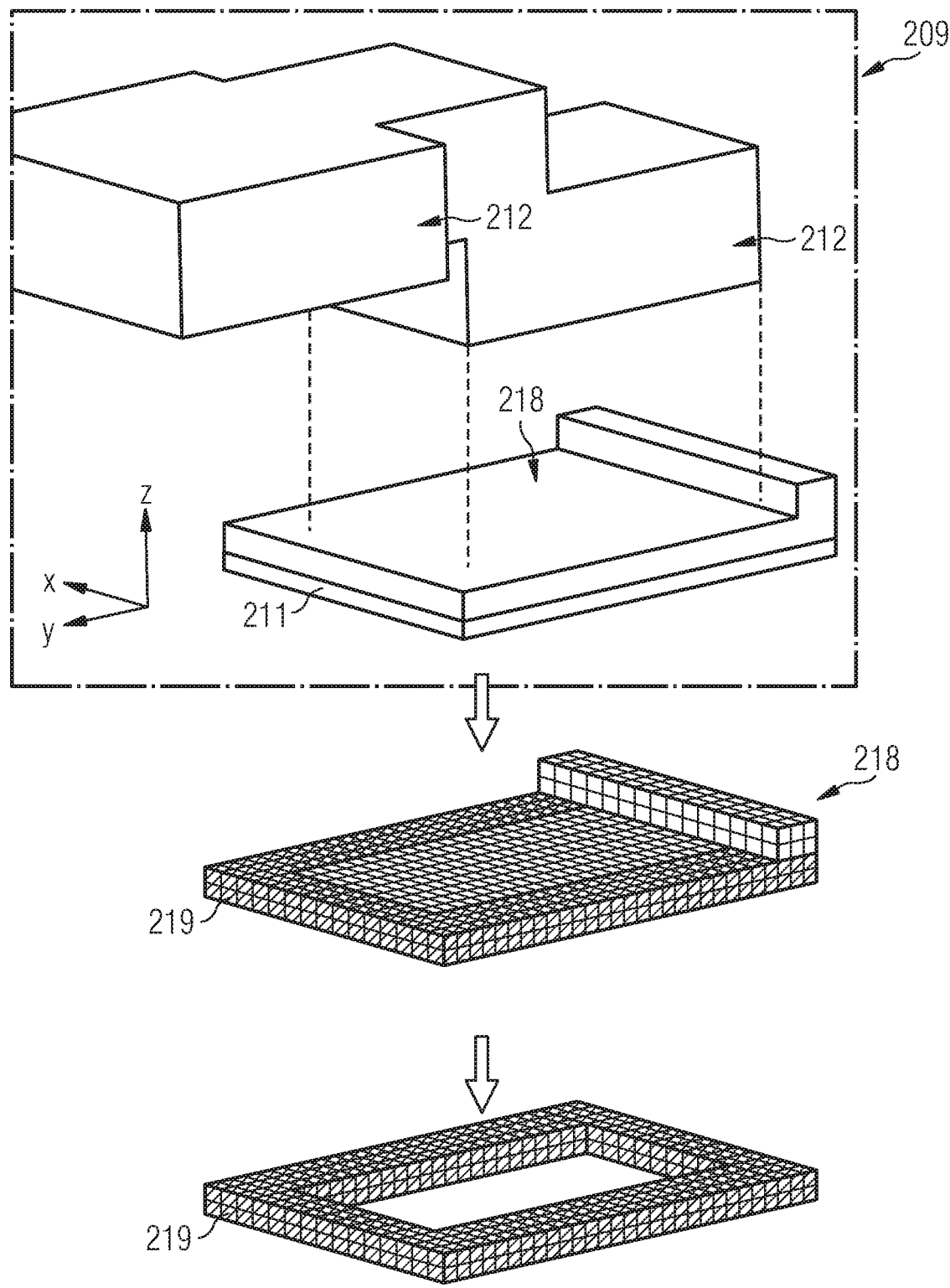
FIG. 32 illustrates a detail of a conventional electronic device.

Simulations of the above described type have been carried out also for the three embodiments of FIG. 24/FIG. 29, FIG. 25/FIG. 30 and FIG. 26/FIG. 31 and have been compared with the conventional configuration according to FIG. 32.

FIG. 32 illustrates a detail of the mentioned conventional electronic device 209 used for the described simulation.

Figure 33:
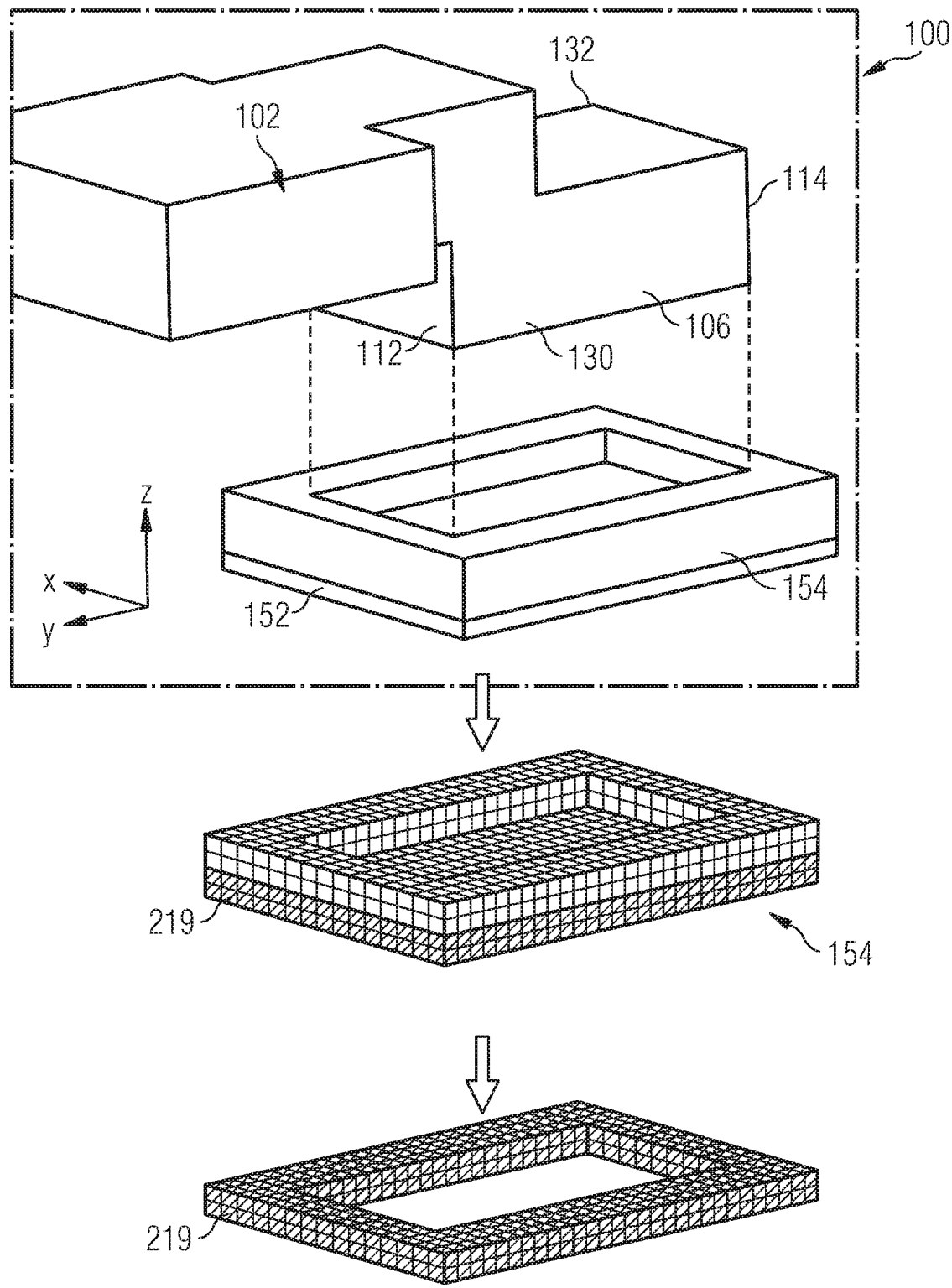
FIG. 33 illustrates a detail of an electronic device according to an exemplary embodiment.

FIG. 33 illustrates a detail of the embodiments of FIG. 24/FIG. 29 and FIG. 26/FIG. 31 used for the described simulation.

Figure 34:
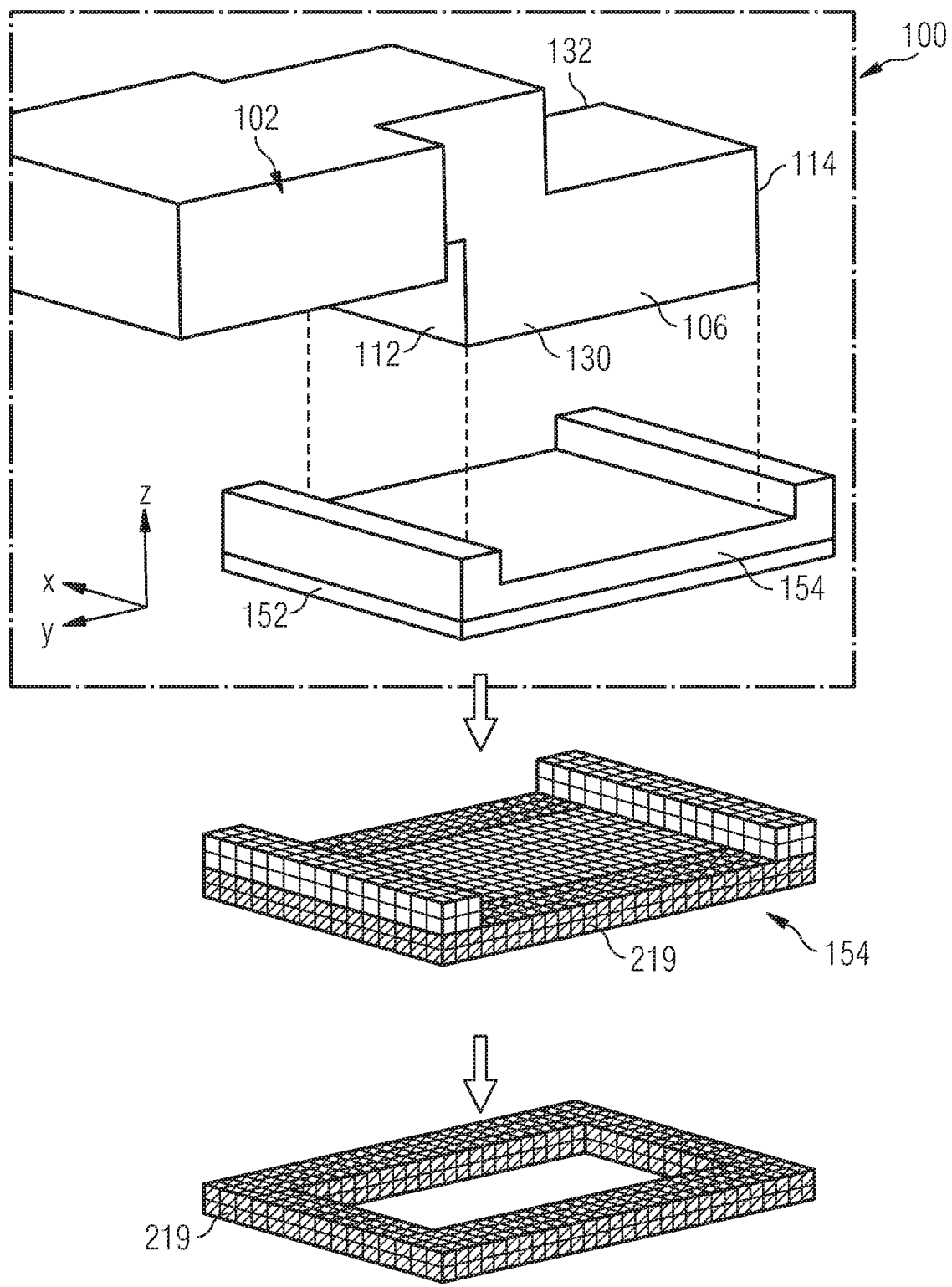
FIG. 34 illustrates a detail of an electronic device according to another exemplary embodiment.

FIG. 34 illustrates a detail of the embodiment of FIG. 25/FIG. 30 used for the described simulation.

In the framework of the mentioned simulation, creep strain average in control volume 219 is assessed. The position of highest solder load (i.e. an expected starting point of a degradation crack) can change depending on the design. Therefore, a control volume 219 is used for evaluation of solder fatigue which contains the whole rim of the bottom part of the solder volume. The size and meshing of the control volume 219 of the four design options (i.e. the three mentioned embodiments as well as the conventional configuration) is exactly the same. The creep strain increment of one thermal cycle is averaged over the control volume 219 and serves as damage parameter for relative comparison, wherein higher accumulation of creep strain indicates higher solder degradation. In order to achieve best comparability of the different options, the solder volumes are meshed identically and the accumulated creep strain of the board solder is evaluated in exactly matching annular control volumes 219 (see FIG. 32 to FIG. 34). These control volumes 219 are located at the rim of the bottom of the board solder volumes as there is the expectation of the highest load acting on the solder.

Figure 36:
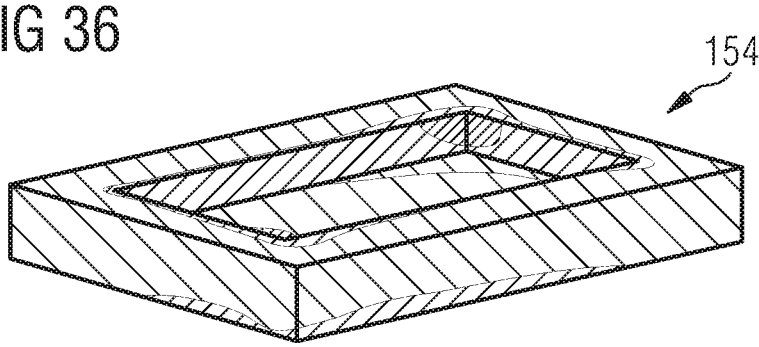
Figure 37:
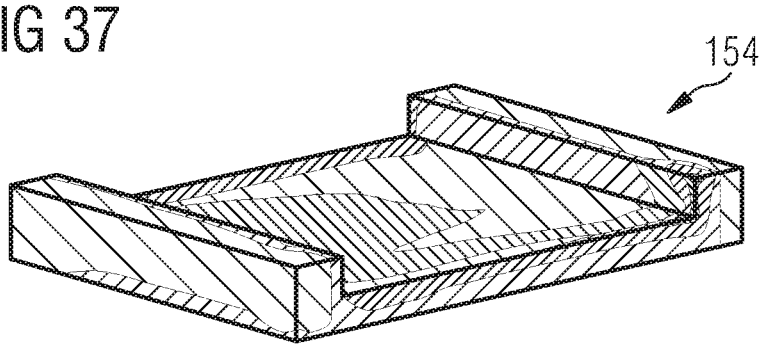
Figure 38:
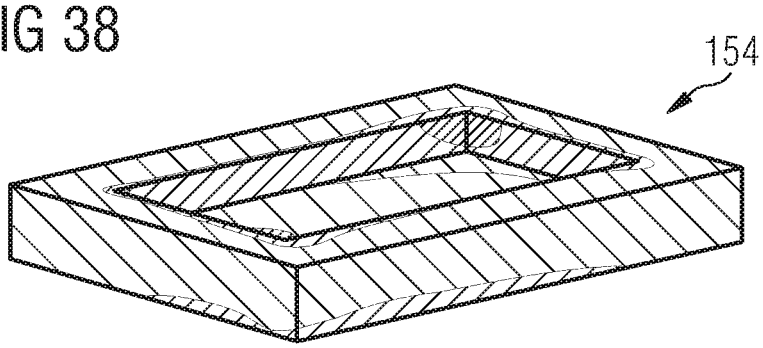

FIG. 35 to FIG. 38 show results of thermal stress simulations of the conventional electronic device 209 of FIG. 32 (see FIG. 35), the embodiment of FIG. 33 and FIG. 29 (see FIG. 36), the embodiment of FIG. 34 (see FIG. 37), as well as of the embodiment of FIG. 33 and FIG. 31 (see FIG. 38).

Accumulated creep strain in the board solder volume of the outer lead at the end of the simulation is shown. The highest loading of the solder indicated by the largest amount of accumulated creep strain is positioned at the outer package side of the single lead for the simulated package, compare FIG. 35. The accumulated creep strain in this area is clearly reduced by the measures taken according to FIG. 36 to FIG. 38. Assuming that a solder fatigue crack would start at the area with highest accumulated creep strain and would then propagate beneath the lead, the measures taken according to FIG. 36 to FIG. 38 may significantly improve the thermal cycling performance of the leadless package 100.

Figure 35:
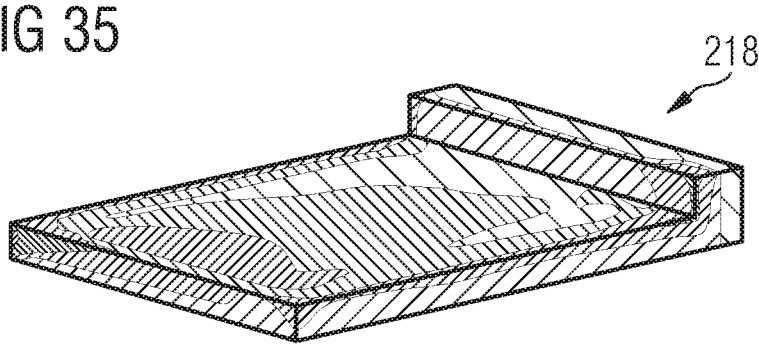
FIG. 35 to FIG. 38 show results of thermal stress simulations of the conventional electronic device of FIG. 32 (see FIG. 35), the embodiment of FIG. 33/FIG. 29 (see FIG. 36), the embodiment of FIG. 34 (see FIG. 37), as well as of the embodiment of FIG. 33/FIG. 31 (see FIG. 38), respectively.

Comparing the conventional electronic device 209 according to FIG. 35 with the three exemplary embodiments according to FIG. 36 to FIG. 38, it can be concluded that the stress acting on the connection structure 154 is significantly lower according to FIG. 36 to FIG. 38 as compared to FIG. 35. Correspondingly, electrical reliability may be improved.

Figure 39:
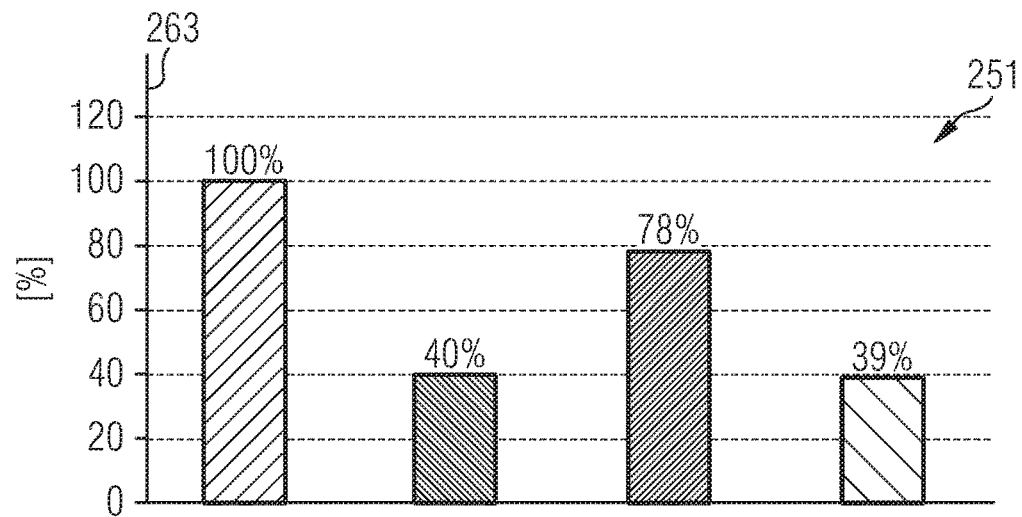
FIG. 39 show a diagram indicating an improved board level reliability of the embodiments of FIG. 36 to FIG. 38 compared to the conventional electronic device (FIG. 35).

FIG. 39 shows a bar diagram 251 indicating, in a similar manner as in FIG. 18, an improved board level reliability of the embodiments of FIG. 36 to FIG. 38 compared to the conventional electronic device 209 (FIG. 35). FIG. 39 illustrates in bar diagram 251 that, when the conventional package is set to a damage value (see ordinate 263) of 100%, the above described exemplary embodiments significantly improve this damage parameter to 40% (see the embodiment of FIG. 29), 78% (see the embodiment of FIG. 30) or 39% (see the embodiment of FIG. 31). The mentioned simulation results clearly indicate a significant improvement of thermal cycling performance for all discussed embodiments.

Figure 40:
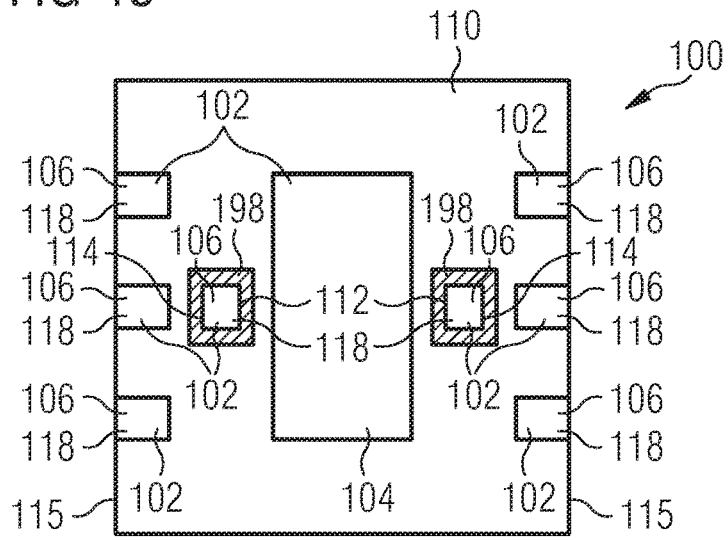
FIG. 40 illustrates a plan view of a leadless package according to an exemplary embodiment.
Figure 41:
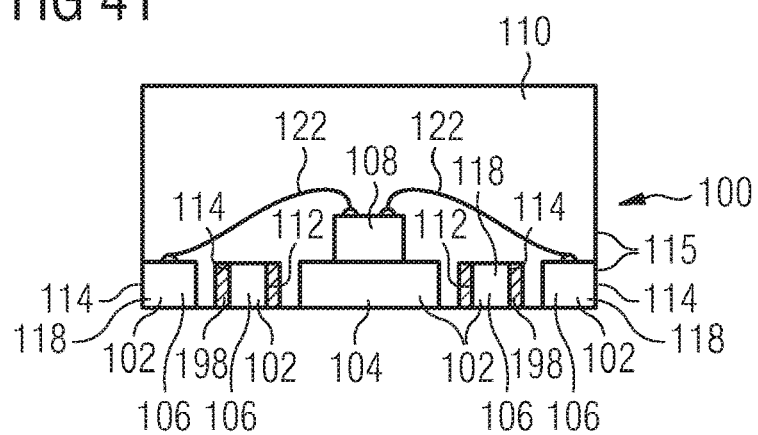
FIG. 41 illustrates a cross-sectional view of the leadless package of FIG. 40.

FIG. 40 illustrates a plan view of a leadless package 100 according to another exemplary embodiment. FIG. 41 illustrates a cross-sectional view of the leadless package 100 of FIG. 40.

In contrast to the previously described embodiments, the leadless package 100 according to FIG. 40 and FIG. 41 not only comprises lead bodies 118 extending with their exterior lateral sidewalls 114 up to a lateral sidewall 115 of the entire package 100. In contrast to this, this embodiment also comprises (in the present example) two lead bodies 118 having exposed sidewalls 112, 114, 130, 132 although being located in an interior of the package 100 spaced with regard to an exterior lateral surface of the package 100. This sidewall exposure of the mentioned circumferentially fully encapsulated lead bodies 118 can be achieved by forming a (in the present example) fully circumferential and substantially rectangular recess 198 surrounding the interior lead bodies 118. This improves the board level reliability in the presence of thermal load also in an interior of the package 100.

Figure 42:
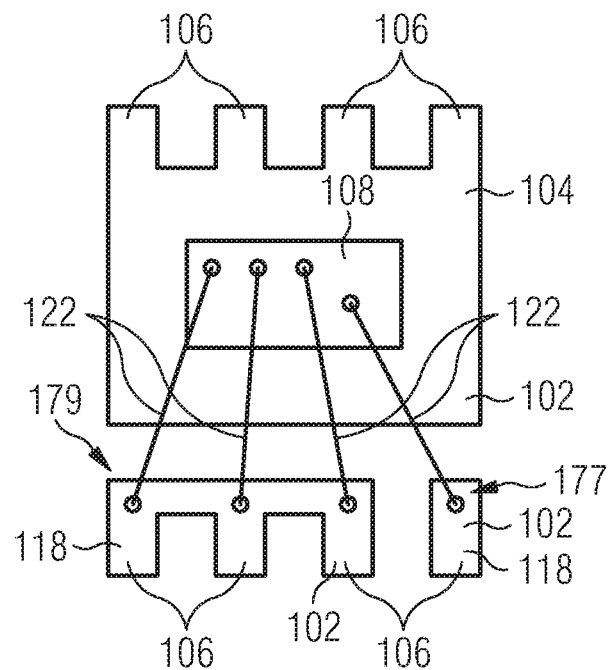
FIG. 42 illustrates a plan view of a carrier with mounted electronic chip and connection elements in between (left-hand side) and a leadless package obtained after encapsulation and sidewall exposure according to an exemplary embodiment (right-hand side).
Figure 42:
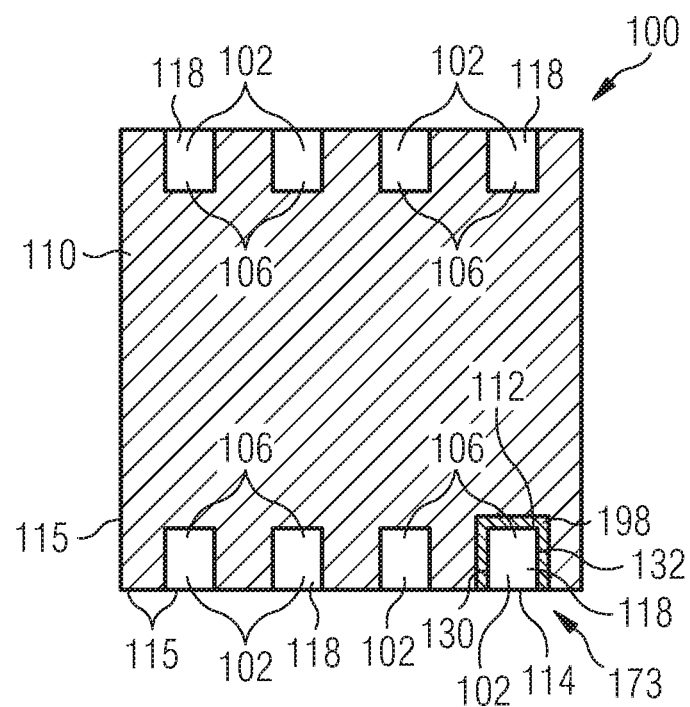

FIG. 42 illustrates a plan view of a carrier 102 with mounted electronic chip 108 and connection elements 122 in between (left-hand side) and a leadless package 100 (right-hand side) obtained after encapsulation by encapsulant 110 and sidewall exposure of only one lead body 118 in a lower right corner (see reference numeral 173) according to an exemplary embodiment.

According to FIG. 42, three of the lead bodies 118 form a continuous integral portion 179 of the carrier 102. Another one of the lead bodies 118 (see reference numeral 177 on the left-hand side of FIG. 42) is separated from the other lead bodies 118. As can be taken from the right-hand side of FIG. 42, exclusively the separated lead body 118 (see reference numeral 177) has fully circumferentially exposed sidewalls 112, 114, 130, 132, as a result of the (here substantially U-shaped) recess 198. It has turned out that in particular such separate lead bodies 118 are specifically prone to failure in the presence of thermal load, so that selectively surrounding such a lead body with a sidewall exposing recess 198 is highly advantageous.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A leadless package, comprising:
   an at least partially electrically conductive carrier comprising a mounting section and a lead section;
   an electronic chip mounted on the mounting section; and
   an encapsulant at least partially encapsulating the electronic chip and partially encapsulating the carrier so that at least part of an interior sidewall of the lead section not forming part of an exterior sidewall of the package is exposed from the encapsulant,
   wherein a ratio between a height up to which the interior sidewall of the lead section is exposed from the encapsulant and a thickness of the carrier is at least 20%.

2. The leadless package of claim 1, wherein the encapsulant partially encapsulates the carrier so that at least two sidewalls of the lead section not forming part of the exterior sidewall of the package are exposed from the encapsulant.

3. The leadless package of claim 1, wherein the encapsulant partially encapsulates the carrier so that at least part of all sidewalls of the lead section is fully circumferentially exposed from the encapsulant.

4. The leadless package of claim 1, wherein the lead section comprises a plurality of spaced lead bodies at least one of which has an interior sidewall at least partially exposed from the encapsulant and not forming part of the exterior sidewall of the package.

5. The leadless package of claim 4, wherein a bottom surface of the encapsulant has at least one recess at least partially exposing at least one interior sidewall of at least one of the lead bodies.

6. The leadless package of claim 5, wherein:
   the at least one recess at least partially surrounds at least part of the lead bodies individually so that spaces between the at least partially exposed interior sidewalls of the lead bodies remain at least partially filled with material of the encapsulant; or
   the at least one recess extends only along one of the at least partially exposed interior sidewalls of at least one of the lead bodies; or
   the at least one recess at least partially exposes at least part of the lead bodies so that spaces between the at least partially exposed interior sidewalls of the lead bodies are free of material of the encapsulant.

7. The leadless package of claim 4, wherein at least two of the lead bodies form a continuous integral portion of the carrier and at least one other one of the lead bodies having an interior sidewall at least partially exposed from the encapsulant is separated from the other lead bodies.

8. The leadless package of claim 4, wherein one of the lead bodies having an interior sidewall at least partially exposed from the encapsulant is located in a corner of the package.

9. The leadless package of claim 4, wherein at least one of the lead bodies having an interior sidewall at least partially exposed from the encapsulant is located completely in an interior of the package spaced with regard to an exterior lateral surface of the package.

10. The leadless package of claim 1, wherein an entire bottom surface of the carrier protrudes beyond an entire bottom surface of the encapsulant.

11. The leadless package of claim 1, wherein:

an exposed bottom surface of the encapsulant is planar; or an exposed bottom surface of the encapsulant between the mounting section and the lead section is non-planar.

12. An electronic device, comprising:

a mounting base;

a leadless package mounted on the mounting base, the leadless package comprising an at least partially electrically conductive carrier comprising a mounting section and a lead section, an electronic chip mounted on the mounting section, and an encapsulant at least partially encapsulating the electronic chip and partially encapsulating the carrier so that at least part of an interior sidewall of the lead section not forming part of an exterior sidewall of the package is exposed from the encapsulant; and a coupling structure electrically and mechanically coupling the package with the mounting base so that the coupling structure contacts at least part of the at least partially exposed interior sidewall of the lead section, wherein an average thickness of the coupling structure in a lateral direction on the interior sidewall of the lead section facing away from an exterior sidewall of the package is larger than an average thickness of the coupling structure in a lateral direction at the exterior sidewall of the lead section.

13. The electronic device of claim 12, wherein the coupling structure has an annular section which fully circumferentially contacts at least part of all sidewalls of the lead section at least partially exposed from the encapsulant.

* * * * *